United States Patent
Chinn et al.

(10) Patent No.: US 7,968,187 B2
(45) Date of Patent: *Jun. 28, 2011

(54) SURFACE COATING

(75) Inventors: Jeff Chinn, Menlo Park, CA (US); W. Robert Ashurst, Auburn, AL (US); Adam Anderson, Auburn, AL (US)

(73) Assignee: Integrated Surface Technologies, Menlo Park, CA (US)

( * ) Notice: Subject to any disclaimer, the term of this patent is extended or adjusted under 35 U.S.C. 154(b) by 78 days.
This patent is subject to a terminal disclaimer.

(21) Appl. No.: 12/209,629

(22) Filed: Sep. 12, 2008

(65) Prior Publication Data
US 2009/0107713 A1  Apr. 30, 2009

Related U.S. Application Data

(60) Provisional application No. 60/983,504, filed on Oct. 29, 2007, provisional application No. 61/029,801, filed on Feb. 19, 2008.

(51) Int. Cl.
*B32B 7/12* (2006.01)
*H01L 23/29* (2006.01)

(52) U.S. Cl. ........ 428/339; 428/142; 428/143; 428/145; 428/148; 428/352; 257/789; 257/791; 257/635; 257/642

(58) Field of Classification Search .................. 174/255, 174/258; 428/142, 143, 145, 148, 339, 352; 257/635, 642, 789, 791
See application file for complete search history.

(56) References Cited

U.S. PATENT DOCUMENTS

| | | | | |
|---|---|---|---|---|
| 5,656,830 | A | * | 8/1997 | Zechman ..................... 257/784 |
| 6,138,349 | A | * | 10/2000 | Vinciarelli et al. ............. 29/841 |
| 6,902,947 | B2 | * | 6/2005 | Chinn et al. ..................... 438/48 |
| 7,329,439 | B2 | * | 2/2008 | Sachdev et al. .............. 427/517 |
| 7,638,167 | B2 | * | 12/2009 | Kobrin et al. .............. 427/248.1 |

* cited by examiner

*Primary Examiner* — Cathy Lam
(74) *Attorney, Agent, or Firm* — Daniel L. Flamm

(57) ABSTRACT

A composite is provided, comprising a substrate and a film on the substrate. The film has an RMS surface roughness of 25 nm to 500 nm, a film coverage of 25% to 60%, a surface energy of less than 70 dyne/cm; and a durability of 10 to 5000 microNewtons. Depending on the particular environment in which the film is to be used, a durability of 10 to 500 microNewtons may be preferred. A film thickness 3 to 100 times the RMS surface roughness of the film is preferred.

22 Claims, 15 Drawing Sheets

Figure 3A	Figure 3C	Figure 3E
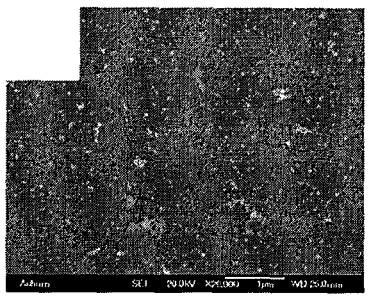 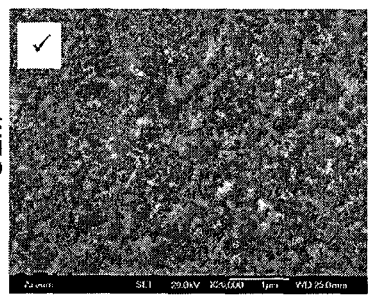 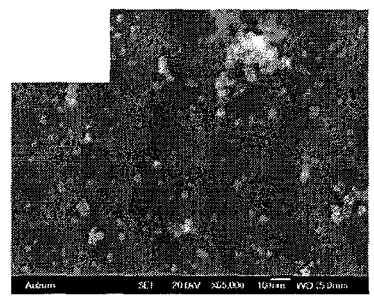
SEM
Figure 3B	Figure 3D	Figure 3F
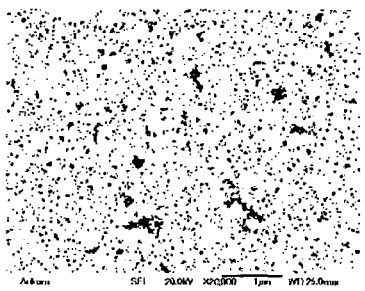 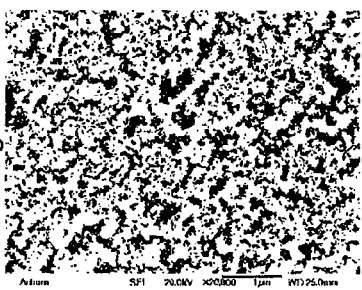 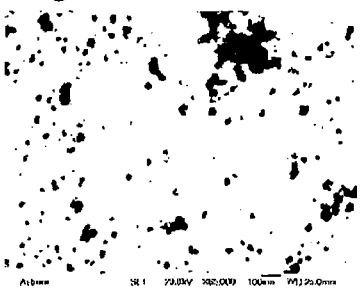
Digital
RMS: ~9nm
Area: 26.43µm²
Particle Area: 2.51µm²
Percentage: 9.32%
Calculation
Area: 26.88µm²
Particle Area: 8.84µm²
Percentage: 32.88%
RMS: ~30nm
Area: 2.62µm²
Particle Area: 0.234µm²
Percentage: 8.94%
FIGURE 3

FIG. 4A

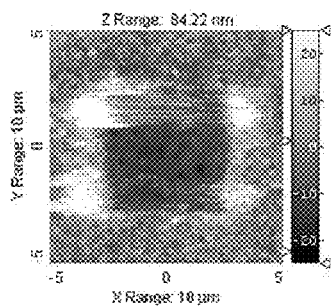

Wear areas from the Standard Film at 10μN. Note that the film seems to be smear or "pushed" around by the stylus.
A film with less durability than shown would be too unstable for protecting a surface. The film could be blown away.

FIG. 4B

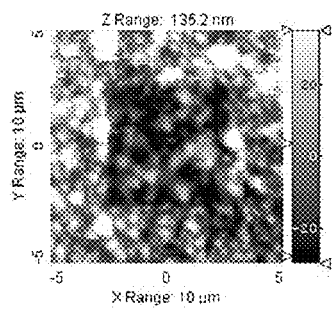

Wear areas from a more durable Film at 10μN. The film is still there although some deterioration is observed.

FIG. 4C

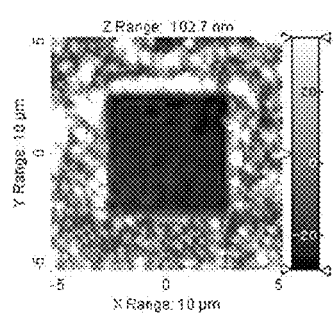

Example where the film is completely removed under a load of 50μN. (All pushed away.)

FIG. 4

| Chemistry | Critical Surface Tension * | Contact Angle >135° | Does it Work ? |
|---|---|---|---|
| DDMS (Dichlorodimethylsilane) (Hydro-carbon) | >75 dyne/cm | NO | NO |
| FDTS (Perfluoronated) | 15-20 dyne/cm | YES | YES |
| OTS (C18) (Hydro-carbon) | 20-25 dyne/cm | YES | YES |
| Octyl-saline (C8) (Hydro-carbon) | 25-35 dyne/cm | YES | YES |

FIGURE 5

Process

- Surface roughness + low surface energy is the key factor to the anti-wetting / ionic contamination control Roughness Measurement

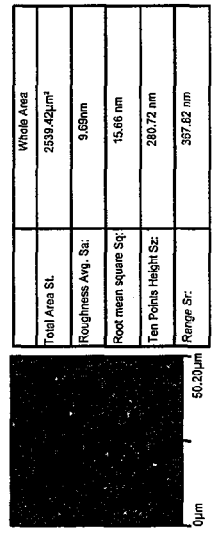

Hydrophobic
RMS=15nm over a 2500μm² area
Contact Angle : 130°

Roughness Measurement

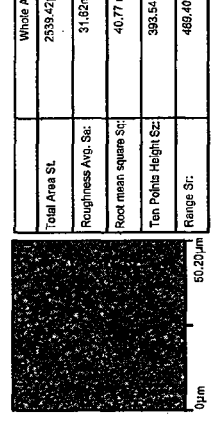

Marginal Super Hydrophobic (Water Rolls off but can stick)
RMS=40nm over a 2500μm² area
Contact Angle : ~140°

Roughness Measurement

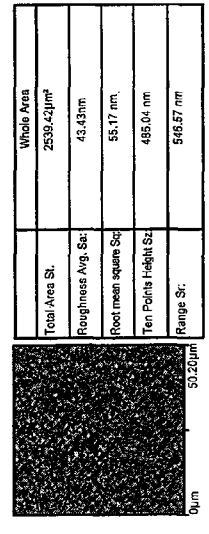

Super - Hydrophobic (Water Drop Bounces)
RMS=55nm over a 2500μm² area
Contact Angle :>165°

FIGURE 10

FIG. 11A
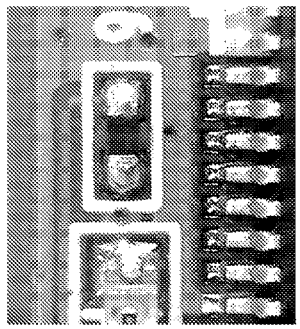
USB 512 MB Memory
Pitch 1500/500μm lead/space

FIG. 11B
Control Sample
Contact Angle: <40°

FIG. 11C
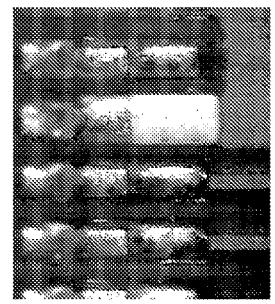
Coated with
Superhyrdophobic
Contact Angle: >165°
No visible film
or thickness

FIG. 11D
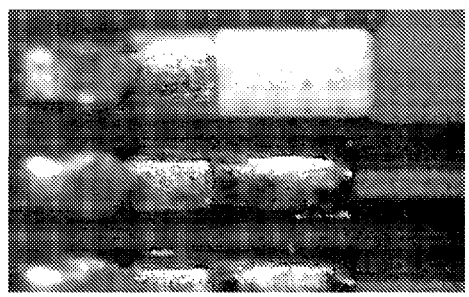
1500μm
500μm

Note 1: There may be a practical limitation on surface roughness. If a surface roughness is too great, then this is similar to whisker formatin or dentrite growth, which becomes undesireable and can cause a short.

Note 2: If a film is too thick (or too rough), then thickness could affect electrical connections between connectors.

FIG. 11

Insufficient Surface Roughness/Density
[RMS Roughness: 15nm
Contact Angle: 130°]
FIG. 12 A
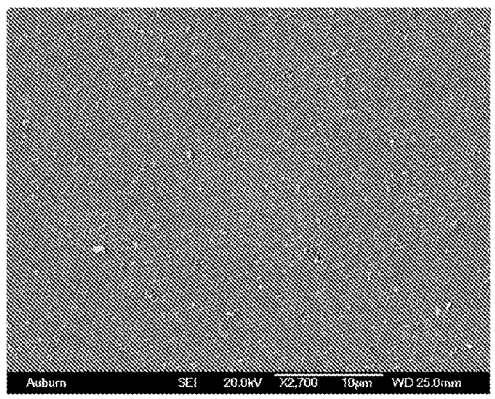
FIG. 12 C
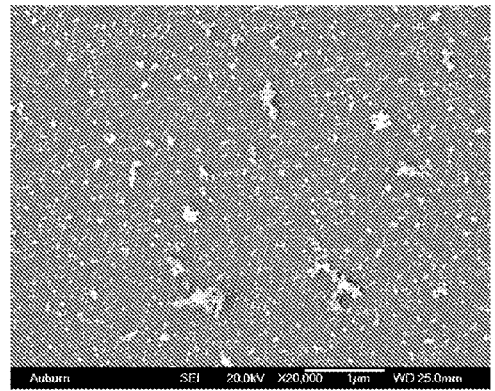
FIG. 12 B
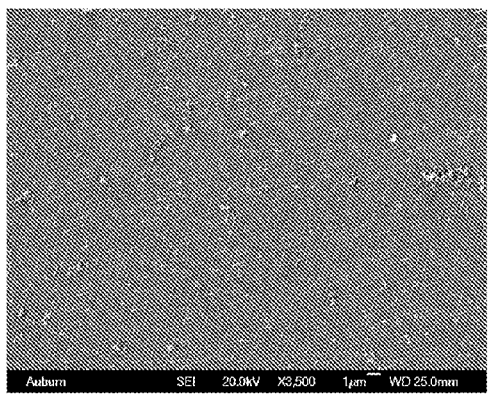
FIG. 12 D
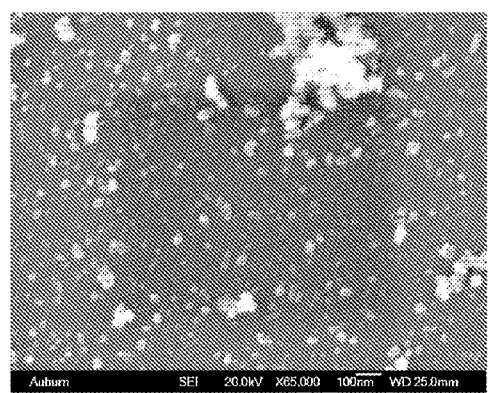
FIG. 12

Required Surface Roughness / Density
FIG. 13A
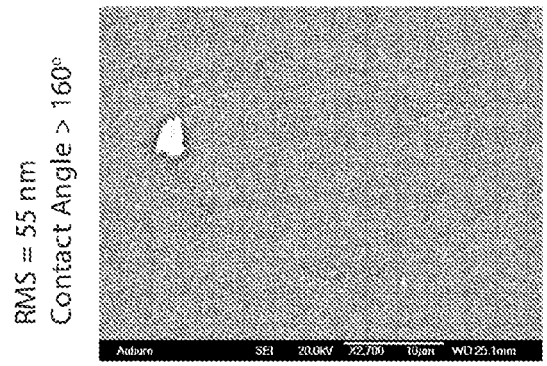
RMS = 55 nm
Contact Angle > 160°
FIG. 13C
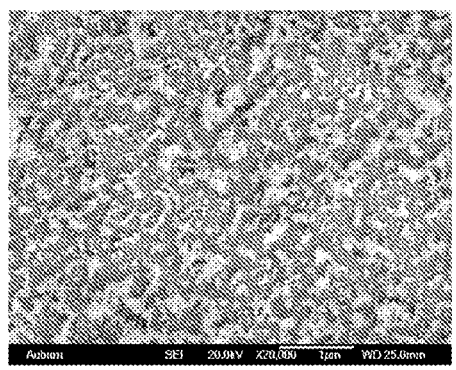
FIG. 13B
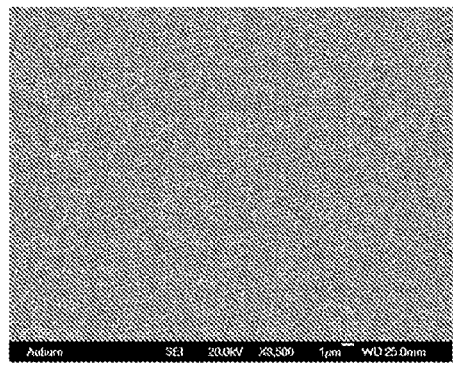
FIG. 13D
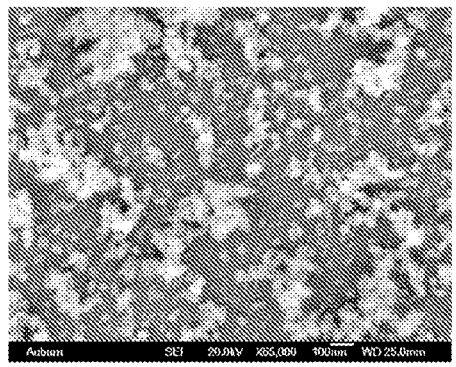
FIG. 13

SEM Showing Surface Roughness of Film With Aluminum Oxide Particles

RMS roughness: 55nm
Contact Angle: >160°

Example of Improve Durability
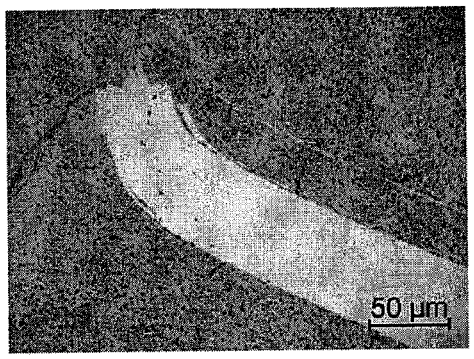
Figure 15A
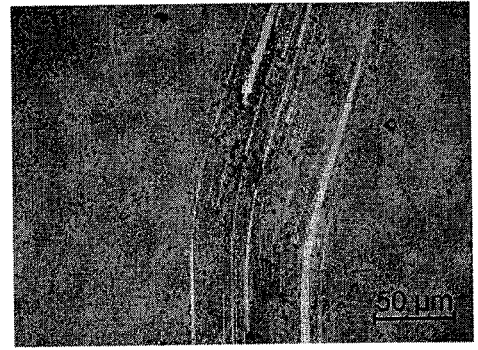
Figure 15B
Fig. (Left): An optical micrograph showing our initial nano-coating with its poor mechanical stability after scratching.
Fig. (Right): An optical micrograph showing the improved JST film. The mechanical endurance is significantly improved.
FIGURE 15

Quantitative Analysis for Good Film
FIG. 16 A
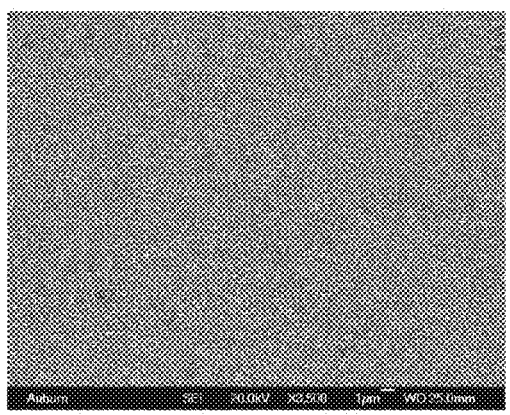
FIG. 16 C
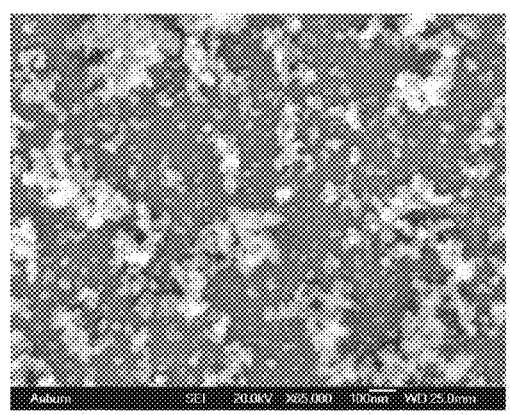
FIG. 16 B
Area: 899μm$^2$
Particle Area: 296.08μm$^2$
Film Coverage: 32.92%
FIG. 16 D
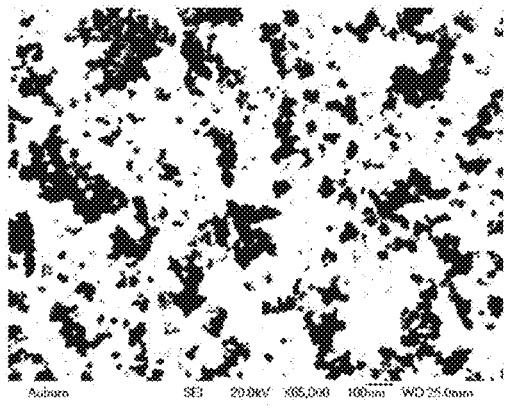
Area: 2.63μm$^2$
Particle Area: 0.776μm$^2$
Film Coverage: 29.5%
FIG. 16

FIG. 17A

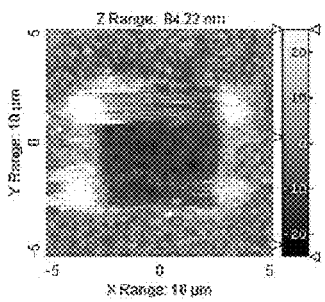

Wear areas from the Standard Film at 10μN. Note that the film seems to be smear or "pushed" around by the stylus.
A film with less durability is too unstable for protecting a surface. The film could be blown away.

FIG. 17B

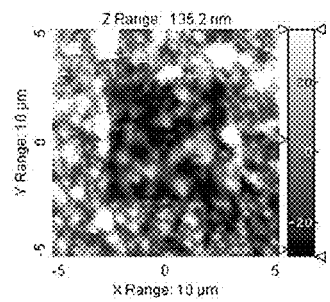

Wear areas from a more durable Film at 10μN. The film is still there although some deterioration is observed.

FIG. 17C

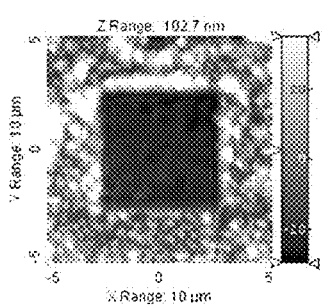

Example where the film is completely removed under a load of 50μN. (All pushed away.)

FIG. 17

SURFACE COATING

CROSS-REFERENCES TO RELATED APPLICATIONS

This application is related to and claims priority from Provisional Application Ser. No. 61/029,801, filed Feb. 19, 2008, 60/983,504, filed Oct. 29, 2007, application Ser. No. 12/115,874, filed May 6, 2008 and application Ser. No. 12/115,875, filed May 6, 2008.

BACKGROUND

Today's conformal coatings include glob-top organic based coatings. Such coatings include acrylics, epoxies, urethanes, parylene or silicone materials. Such conformal coatings provide limited environmental protection from moisture, dust, vibration, and provide physical protection from handling.

Today's conformal coatings are typically several mils thick. The thinnest conformal coating produced today is made of vapor-deposited parylene and is about 15 µm thick. Thick conformal coatings can be problematic. For example, during any rework of a printed circuit board, a previously applied thick conformal coating may need to be removed (e.g., by dissolution or physical abrasion). This is time consuming, expensive and difficult. Also, thick conformal coatings can undesirably impede the transfer of heat from an electrical apparatus such as a chip or circuit substrate.

Conformal coatings are also not completely foolproof. Conformal coatings are typically not applied over electrical connectors as they affect the contact resistance. For example, if a cell phone with a thick conformal coating is immersed in a body of water, there is a high probability that the phone will not work. This is because residues or contaminated liquids can form leakage pathways between the various exposed components, connectors, assemblies or surfaces not coated.

Improvements can be made to such coatings.

SUMMARY

Embodiments of the invention are directed to novel films.

Embodiments of the invention are directed to surface coatings, articles including such surface coatings, and methods for forming surface coatings.

One embodiment of the invention is directed to a method comprising: depositing nano-particles on a substrate surface using a liquid deposition process, to form an ionic barrier with anti-wetting or super-hydrophobic properties on the substrate.

Another embodiment of the invention is directed to an article comprising: a substrate; and a coating on the substrate, wherein the coating has a surface roughness between about 25-500 nm RMS over an area of at least about 2500 µm$^2$.

These and other embodiments of the invention are described in detail below.

One embodiment of the invention is directed to a composite comprising: a substrate; and a film on the substrate, wherein the film has at least two, and preferably all, of the following properties a)-d):
a) Film Roughness: 25<RMS (nm)<1000 (preferably 30<RMS (nm)<150) (Average roughness). Preferred ranges for RMS roughness also include 30<RMS (nm)<1000 and 25<RMS (nm)<500.
b) Film Coverage: 25<Coverage (%)<60 (Average density)
c) Film Durability: 10<Force (µ-Newtons)<500 (Force) (it is noted that the film durability may be greater than about 500µ-Newtons in some embodiments)
d) Surface Energy: 15<Energy (Dyne/cm)<70 (Zisman Critical angle). Surface energy may be less than 15 dyne/cm in some embodiments.

In one aspect, a composite is provided, comprising a substrate and a film on the substrate. The film has an RMS surface roughness of 25 nm to 500 nm, a film coverage of 25% to 60%, a surface energy less than 70 dyne/cm, i.e., zero to 70 dyne/cm; and a durability of 10 to 5000 microNewtons. Depending on the particular environment in which the film is to be used, a durability of 10 to 500 microNewtons may be preferred. A film thickness 3 to 100 times the RMS surface roughness of the film is preferred.

The film may comprise non-conductive particles linked to each other and to the substrate by linker molecules. Preferred non-conductive particles include metal oxide or semiconductor oxide particles. Specific preferred materials for the non-conductive particles include alumina and silica. Where the non-conductive particles are alumina, a particle size of about 40-60 is preferred, and more preferably 40-50 nm. Where the non-conductive particles are silica, a particle size of about 10-20 nm. is preferred. The nano-particles shape could be round spheres, flatten discs, rods, nails, hollow spheres or other shapes with the preferred diameter. Latex particles are also preferred. Preferred linker molecules include those selected from the group consisting of bi-functional linkers such as bis-trichlorosilane-ethane, bis-trichlorosilane-butane, bis-trichlorosilane-hexane, bis-trimethoxysilane-ethane, bis-trimethoxysilane-butane, bis-trimethoxysilane-hexane, bis-tris-dimethylaminosilane-ethane, bis-tris-dimethylaminosilane-butane, and bis-tris-dimethylaminosilane-hexane. Preferred linker molecules include silanes with a reactive group at both ends.

The film may further comprise a low surface energy coating, having a thermodynamic surface energy of less than 70 dyne/cm, disposed over the non-conductive particles and linker molecules. Preferred materials for the low surface energy coating include materials selected from the group consisting of long chain hydrocarbons, long chain fluorocarbons, phosphonates, thiols and rings. Specific preferred materials include C8 (n-Octyltrichlorosilane ($C_8H_{17}Cl_3Si$)), C10 (n-Decyltrichlorosilane ($C_{10}H_{21}Cl_3Si$)) or n-Decyltriethoxysilane ($C_{16}H_{36}O_3Si$), C11 (Undecyltrichlorosilane ($C_{11}H_{23}Cl_3Si$)), C12 (Dodecyltrichlorosilane ($C_{12}H_{25}Cl_3Si$)) or Dodecyltriethoxysilane ($C_{18}H_{40}O_3Si$)), C14 (Tetradecyltrichlorosilane ($C_{14}H_{25}Cl_3Si$)), C18 (n-Octadecyltrichlorosilane ($C_{18}H_{37}Cl_3Si$)) or (n-Octadecyltrimethoxysilane ($C_{21}H_{46}O_3Si$)), FDTS ((Heptadecafluoro-1,1,2,2-TetraHydrodecyl)Trichlorosilane ($C_{10}H_4Cl_3F_{17}Si$)), FODCMS ((Tridecafluoro-1,1,2,2-Tetrahydro-Octyl)methyldichlorosilane) ($C_9H_7Cl_2F_{13}Si$)), FOTS ((Tridecafluoro-1,1,2,2-Tetrahydro-Octyl)Trichlorosilane $C_8H_4Cl_3F_{13}Si$)) or ring like structures such as (Pentafluorophenylpropyl-trichlorosilane ($C_9H_6F_5Cl_3Si$)).

Preferred substrates include a printed circuit board and a consumer electronic device.

Methods of making a film are also provided. A film may be made by depositing nanoparticles on a surface of a substrate using a liquid deposition process, and linking the nanoparticles to each other and to the surface using linker molecules. A coating having a surface energy of less than 70 dyne/cm may be deposited over the film to form a coated film. The film preferably has the surface roughness, film coverage, surface energy and durability described above. The materials and other parameters described above are also preferred.

Preferably, the nanoparticles pre-treated with protected linker molecules prior to deposition on a surface of a substrate, and the nanoparticles are linked to each other and to the surface using the linker molecules by deprotecting the linker molecules.

Embodiments of the invention are directed to specific combinations of these different aspects, as well as specific embodiments related to those specific aspects. Further details regarding embodiments of the invention are provided below in the Detailed Description, Claims, and Appendix.

BRIEF DESCRIPTION OF THE DRAWINGS

FIG. 3 shows surfaces for which surface coverage has been calculated. FIGS. 3A, 3C and 3E show scanning electron microscope (SEM) images of 3 different surfaces. FIGS. 3B, 3D and 3F show digital images corresponding to the SEM images of FIGS. 3A, 3C and 3E, respectively.

FIG. 4, including FIGS. 4A, 4B and 4C show wear images.

FIG. 5 shows a table with test data of films which have been treated with various low surface energy coatings.

FIG. 11, including FIGS. 11A, 11B, 11C and 11D show USB memory devices with various coatings, including no coating, and at various magnifications exposed to an ionic electrolyte of Gatorade®.

FIG. 12, including FIGS. 12A, 12B, 12C and 12D show scanning electron micrographs (SEM) of coatings at different magnifications which do not exhibit the desired properties due to a lack of surface coverage.

FIG. 13, including FIGS. 13A, 13B, 13C and 13D show scanning electron micrographs (SEM) of coatings at different magnifications. The coating of FIG. 13 was fabricated differently from that of FIG. 12, and has a different surface coverage which does exhibit the desired properties.

FIG. 15, including FIGS. 15A and 15B show scratch test data of two films in which one was treated with a linker chemistry.

FIG. 16, including FIGS. 16A, 16B, 16C and 16D shows surface coverage measurements. FIGS. 16A and 16C show SEM micrographs at different magnifications. FIGS. 16B and 16D are their corresponding digitized coverage images.

FIG. 17, including FIGS. 17A, 17B and 17C show the results of scratch testing on different films and/or with different testing parameters.

DETAILED DESCRIPTION

Some aspects of the invention are directed to a new barrier film, which can protect printed circuit boards and electronic assemblies from failures caused by ionic materials. In some aspects of the invention, a special textured surface is created on an electrical apparatus such as a circuit substrate (e.g., a circuit board, a circuit card, a connector, etc.). This textured surface can be a barrier that can repel ionic contaminants. Most circuitry failures occur when contamination results in leakage or where conducting pathways form between the various electrical conductors (e.g., leads on a printed circuit board). Some aspects of the invention prevent such electrical leakage paths from forming.

Figure 1:
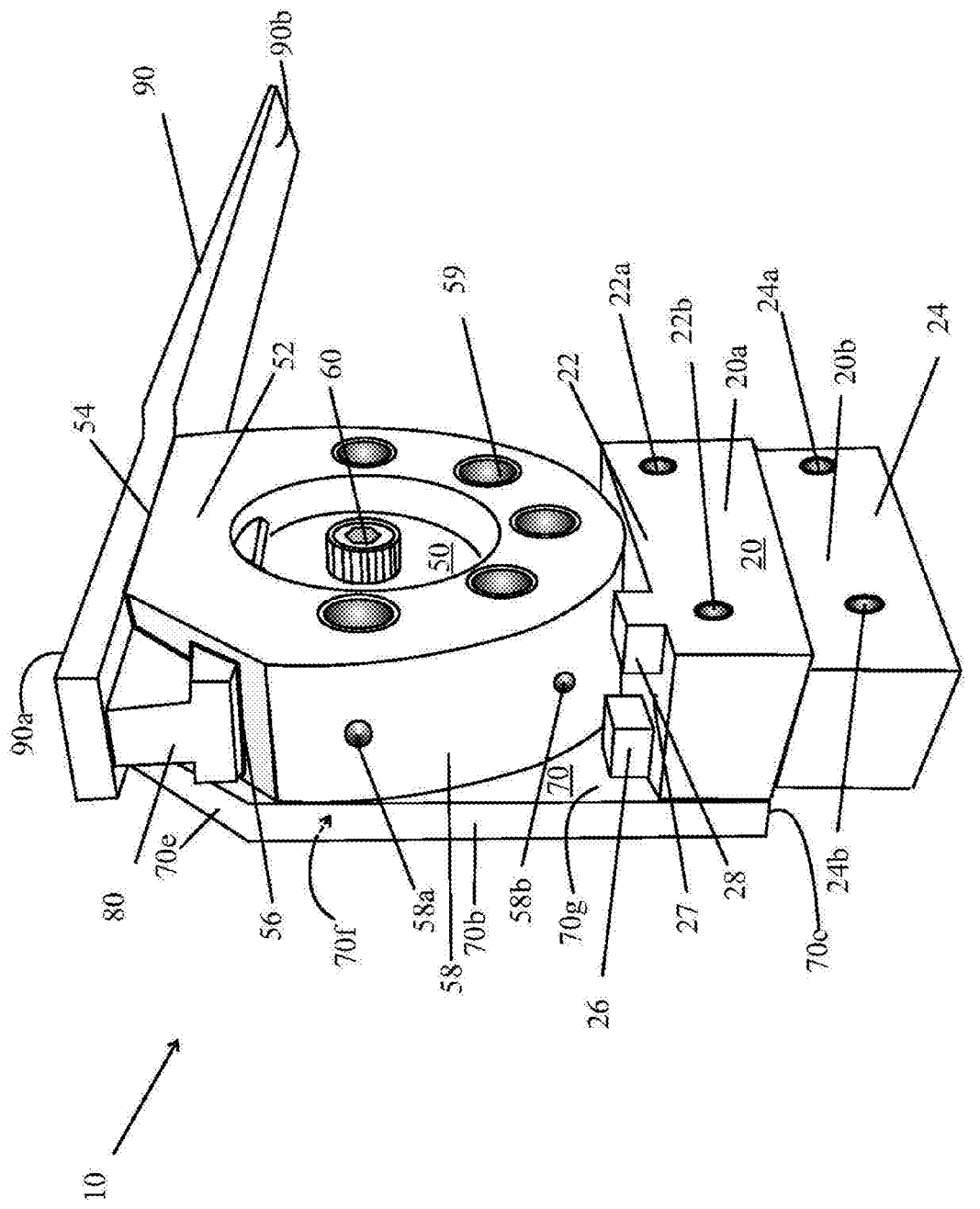
FIG. 1 shows a diagram illustrating components of a composite film.

FIG. 1 shows a diagram illustrating components of a texturized, composite film. Nanoparticles 120 are linked to each other and to a substrate 110 by linker molecules 130. A low surface energy coating 140 is disposed over the nanoparticles 120 and the linker molecules 630.

Nanoparticles 120 are preferably non-conductive. Metal oxide or semiconductor oxide particles are preferred. Specifically, alumina and silica particles are preferred. Where the nanoparticles are alumina, a particle size of about 40-60 nm, more preferably 40-50 nm, is preferred, where particle size is according to industry standard measurements that correlate more or less to the particle diameter. Where the nanoparticles are silica, a particle size of about 10-20 nm is preferred. Other types of nanoparticles may be used, including but not limited to latex nanoparticles. Hollow silica particles, which incorporate a substantial amount of air, may improve resistance to oils and other solvents.

Process parameters may be controlled to obtain a film having an RMS surface roughness of 25 nm to 500 nm, a film coverage of 25% to 60%, a surface energy of less than 70 dyne/cm, and a durability of 10 to 5000 microNewtons. Such a film is particularly desirable for the following reasons.

Figure 2:
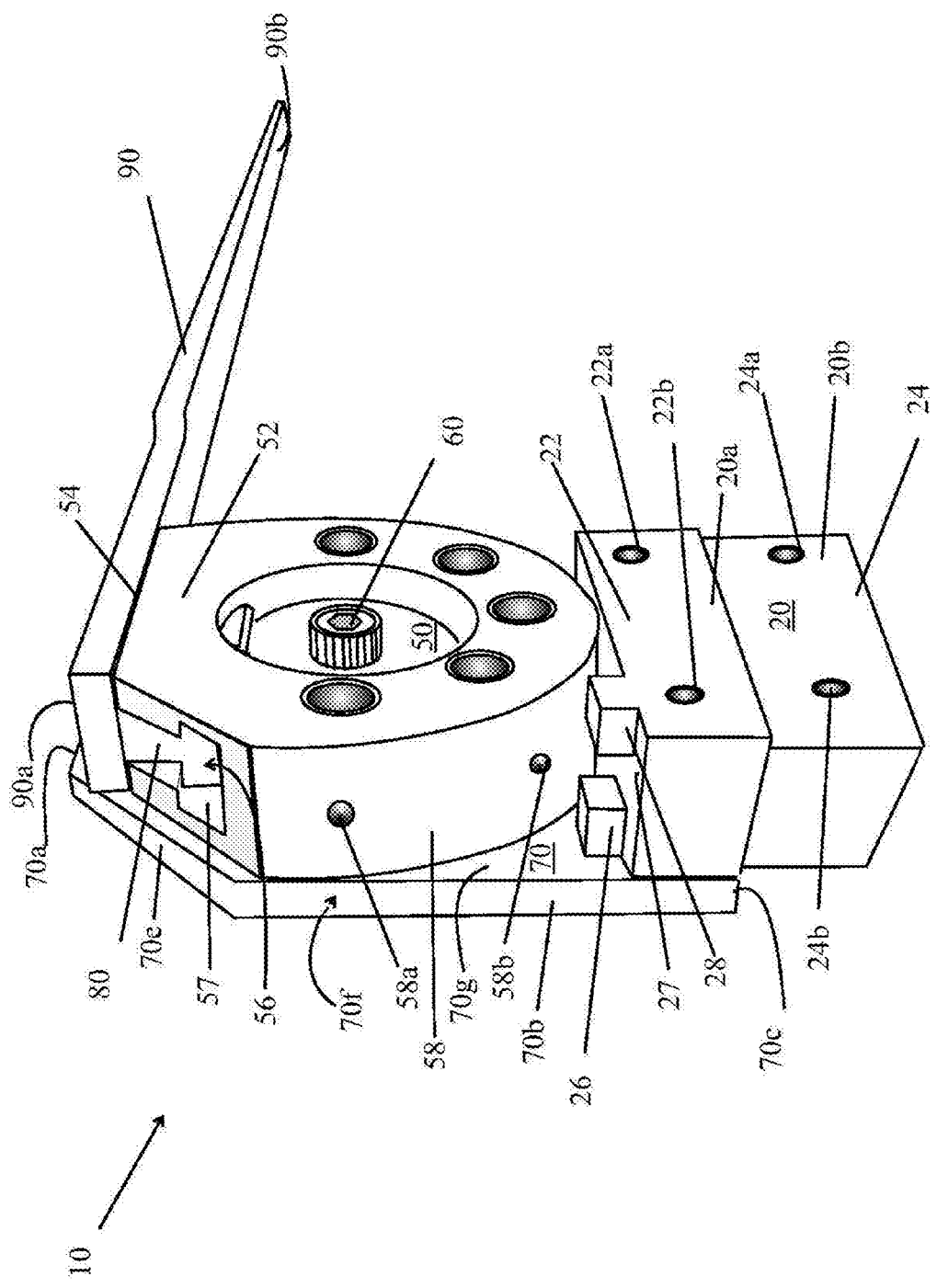
FIG. 2 shows an illustration of three surfaces having the same RMS surface roughness but different surface coverages. Both topographical and digital coverage views of the surfaces are provided.

First, the combination of surface roughness, film coverage, and surface energy results in a film sufficiently resistant to wetting by aqueous solutions (water, coffee, sodas) and organic solvents to which electronics may be exposed during use. As a result, the electronics may survive conditions that would otherwise have rendered them inoperable. Each of the parameters is important. For example, as illustrated in FIG. 2, surface roughness alone is not sufficient to provide the type of surface desired, and two surfaces having the same surface roughness but different film coverage may have very different surface topography and, hence, different resistance to wetting.

Second, the durability range results in a film that is sufficiently durable to resist many of the environmental conditions to which an electronic device might be exposed. Durabilities that are too much lower may result in films that are removed during normal use of a device. However, the durability is still low enough to allow for convenient fabrication and rework. Specifically, the film may be applied to different parts before an electrical connection is made. Then, when the connection is made, the film has a durability low enough that the film may be readily removed during the connection process. A durability of 10 to 5000 microNewtons is sufficiently low to allow for connections at the printed circuit board level. Where a film that will allow for good electrical connections at the chip level is desired (eg. thin film flex circuit boards in which connections are spring-loaded contacts), a durability having a lower top range is preferred, i.e., a durability of 10 to 500 microNewtons is preferred.

A film thickness that is 3 to 100 times the surface roughness of the film is preferred. Such a film is thick enough to ensure that the underlying substrate is adequately protected from moisture, but is not so thick that fabrication times increase, excess material is present, or issues with electrical connections arise. Depending upon the application, however, much thicker films may be used, up to 10,000 times the RMS surface roughness, or even greater.

Substrate 110 may be any electrical part that can benefit from protection from fluids. A printed circuit board is one example of such a substrate. More generally, any electronic device may be used as a substrate. Consumer electronic devices, including flash memory, MP3 players, cell phones, personal digital assistants (PDAs), video game consoles, portable video game consoles, computers, laptops, monitors, keyboards and others, may be used as a substrate, where such devices have electronics that could benefit from water resistance protection.

When an electrical assembly includes a film having a texturized surface according to an embodiment of the invention, a polluted or contaminated liquid cannot form a liquid-solid interface, which can lead to shorts and low level leakage resulting of device failure or reliability issues. The texturized film provides liquid resistance for the electrical apparatus.

The film with the textured surface can be formed with nanoparticles and can consequently be very thin. The film is virtually invisible and does not affect the performance of the electrical apparatus.

The underlying reasons for using the textured film according to embodiments of the invention are different than the reasons for using a thick glob-top conformal coating. For example, when a glob-top coating is used, a thicker coating is generally better, because of greater physical protection or a physical barrier is provided with a thicker coating. In contrast, embodiments of the invention use a thin film as a liquid repellant barrier. The thin film can be effective, even though it is scratched. The same is not true for other conformal films. Unlike a conformal coating, a thin textured film according to an embodiment of the invention does not interfere with the electrical conductivity of a conductor, but it still protects the conductor from ionic solutions.

The textured films according to embodiments of the invention are particularly useful directly on electrical connectors. Current conformal coatings cannot be applied to electrical connectors since they are non-conductive and will increase the resistance between two conducting and contacting surfaces. However, in embodiments of the invention, a male connector and/or a female connector can be coated with the texturized films. Preferably both are coated. The texturized films can protect the connector surfaces from ionic contamination and shorts. If the female connector abrades the texturized film on the male connector (or vice-versa), the abraded texturized film would still protect conductors in the male connector from shorting out if the male connector is exposed to an ionic liquid such as water. The texturized films on the female and male connectors are thin enough so that the abrasion of either textured film can cut through the other film and provide for a low resistance connection. Low electrical resistance is desirable, since any increases in contact resistance can have a direct effect on the battery life and device performance of portable and low voltage electronic devices.

In addition, because some of the films disclosed herein may have reduced interference with electrical connections, rework may be significantly easier. With a glob-top coating, it may be necessary to locally (or globally) remove the coating prior to rework, and replace the coating after rework. With some of the films described herein, however, it may be possible to simply perform the rework without removing or replacing the film.

Because some of the films disclosed herein are significantly thinner than glob-top coatings, heat entrapment issues may be less.

Tests have shown that electronic devices (e.g., cell phones, PDA's or MP3 players) that use the texturized coatings according to embodiments of the invention can still function when they are immersed in electrolyte solutions. For example, flash memory drives (USB sticks) were coated with the texturized films using methods according to embodiments of the invention. The processed flash memory drives were tested by immersing them in Gatorade® (potassium phosphate+citric acid). A control sample shorted out in 2 seconds, while the test samples worked for up to 10 minutes while being immersed in Gatorade®.

As noted above, the texturized films according to embodiments of the invention are thin. They can be less than about 5000 Å (typically at 1000 Å). A coating according to an embodiment of the invention can be about $1/250^{th}$ the thickness of a conventional parylene conformal coating.

Embodiments of the invention can also include coatings with specific properties. For example, a textured film according to an embodiment of the invention can have one, two, or more of the following properties in Table 1. A variety of different methods may be used to make textured films with such properties. It is also possible to tune one or more of the properties (e.g., the physical abrasion characteristics or durability of a textured film).

TABLE 1

| | |
|---|---|
| Textured Roughness | 25 < RMS (nm) < 500 (Average roughness) |
| Textured Coverage | 25 < Coverage (%) < 60 (Average density) |
| Textured Durability | 10 < Force (micro-Newtons) < 5000 (or 500) (Force) |
| Thermodynamic Surface Energy | <70 (Zisman Critical angle) |

The composition of the textured film can vary. Since the conformal coating covers a conducting surface, a non-conducting material is generally used. In preferred embodiments of the invention, non-conducting particles are attached to a surface of a conductor such as a metal base (e.g., a copper line or copper pad). Suitable particles may comprise ceramics such as aluminum oxide, titanium oxide, silicon oxide, etc. In other embodiments of the invention, the particles that form the textured film can be organic latex spheres.

A textured film according to an embodiment of the invention can be produced according to any suitable process. For example, the textured film can be created using a subtractive process (e.g., etching, creating pits, etc.) or an additive process. Preferred embodiments use additive processes to create the textured films.

Additive processes include liquid and vapor deposition processes. In a liquid deposition process, particles can be suspended in a liquid medium and can then be transported to the surface to be treated using a spray technique. In other embodiments, the textured film can be created using chemicals that react in a gaseous state or with chemically modified surfaces to create particles. The particles can then be transported to the surface to be treated by Van der Waals forces, gravity, or by fluid transport in a gas stream.

A textured film with a nano-structure can be created by a variety of methods, including dry and wet processing. One dry method is an atomic layer deposition reaction (ALD). Precursors for creating many materials via ALD are known to the art. For alumina, useful precursors include trimethylaluminum or TMA ($Me_3Al$), diethyl aluminum ethoxide ($(C_2H_5)_2AlOC_2H_2$), and tris(diethylamino)aluminum. For silica, useful precursors include silicon tetrachloride ($SiCl_4$), Tretraethylorthosilicate (TEOS) ($Si(OC_2H_5)_4$) and disilane ($Si_2H_6$). For titania, useful precursors include Titanium Tretrachloride (TiCl$_4$) and tetrakis(dimethylamino)titanium (C$_8$H$_{24}$N$_4$Ti). Oxidizing agents such as ozone (O$_3$), oxygen plasma, or water vapor (H$_2$O) are often used in such ALD processes. ALD is used in many applications to obtain atomically smooth surfaces and/or coatings having an atomically uniform thickness, but can also be readily used to obtain rougher surfaces. (References: U.S. Pat. No. 6,426,4307. N. P. Kobayashi et al./Journal of Crystal Growth 299 (2007) 218-222, Sandia National Labs: LDRD Project 52523 Final Report, Atomic Layer Deposition of Highly Conformal Tribological Coatings—2005) CVD is used in many application can be used to create alumina nano-particles as noted by the work of Kim. (Reference: Kim et al, J. Material Engineering, (1991) 13:199-205) More generally, vapor flow-through technologies may be used as dry methods of creating textured film with a nano-structure.

Wet methods for obtaining a film with a nano-structure include applying a suspension of particles in a solution to a surface. Nanoparticles having specified properties can be commercially obtained from a number of sources. One such source is Nanophase Technologies Corp. of Romeoville, Ill., www.nanophase.com. Application methods for wet sprays can be obtained from many several commercially sources such as Asymtek (www.asymtek.com), PVA (www.pva.net) or Ultrasonic Systems (www.ultraspray.com)

Surface coverage requirements can also be taken into consideration. Textured film coverage on the surface to be treated can be controlled by controlling the flux of the various media, which creates the particles, and controlling the time of the particle flux. Rough surfaces may not be sufficient to provide protection for the printed circuit boards. In some instances, a device coated with a textured film had a rough surface as measured with an AFM (atomic force microscopy), but the device could still failed from an ionic (electrical) leakage.

The AFM technique for measuring roughness (RMS=root mean square) does not capture all relevant topographical information. In addition to a desired RMS roughness, a textured film preferably has a sufficiently wide coverage area on the surface to be treated. It is possible to define this as the "surface coverage" or "density" of the nano-particles in the textured film. In FIG. 2, three different cases provide the same RMS value of roughness, but the coverage needs to be greater than 6% (preferably greater than 20%) before the textured coating is deemed suitable for protecting the surface (in this application).

A textured film having porosity may be useful. It is believed that porosity in the textured film may help prevent fluids from reaching a protected surface by creating an air boundary layer between any liquid and the conducting surface.

FIG. 2 shows a digital map that is used to calculate the surface coverage. As shown, specific surface coverage values can be desirable. FIG. 3 also shows additional surface coverage data.

In some embodiments, the particles in the textured film can be attached to a surface to be treated using a "glue." The "glue" can provide the textured film with durability. Use of a "glue" type surface chemistry can bind particles together and can make the textured film more durable. The "glue" may be referred to as linker molecules or coupling agents. Preferred linker molecules include silanes with a reactive group at both ends. Suitable chemistries include the use of bi-functional linkers such as bis-trichlorosilane-ethane, bis-trichlorosilane-butane, bis-trichlorosilane-hexane, bis-trimethoxysilane-ethane, bis-trimethoxysilane-butane, bis-trimethoxysilane-hexane, bis-tris-dimethylaminosilane-ethane, bis-tris-dimethylaminosilane-butane, and bis-tris-dimethylaminosilane-hexane. Methoxy-ethoxy type linkers are particularly suitable for wet chemistry processes. Dimethyl-amines may be preferred in some situations over chloro-silanes, because the reaction product is a non-corrosive di-methyl-amine as opposed to HCl, which may be corrosive when exposed to water. Tetrachlorosilane is also a suitable linker.

Since the distance or geometric distance of the nano-particles in relation to each other can vary, and a combination of different linker chemistries can be used to improve durability (e.g., molecules of different lengths can be used to bind nanoparticles together and/or to the surface to be treated). Durability is desirable, since the nano-particles in the textured film are preferably stable enough to adhere to the surface to be treated and also to each other. Some nano-particle based films are so porous or loosely bound that they self-disintegrate or dissolve with the slightest disturbance (e.g., a light airstream). The durability of the texturized film can be controlled by controlling the exposure time of the chosen linking chemistry to particles which increases the number of binding sites between neighboring particles.

It is also possible to vary the gluing process. For example, a surface to be treated can be exposed to gluing chemistries, and the nanoparticles can be deposited thereon. In an alternative embodiment, the nano-particles themselves may be exposed to the gluing chemistries and the resulting intermediate product may then be bound to the surface to be treated.

Preferably, the nanoparticle may be pre-treated with protected linker molecules prior to deposition. A "protected" linker will not link with other nanoparticles or reacted to other surfaces during the deposition process. Then, after the pre-treated nanoparticles are deposited, the linker molecules may be deprotected, such that they link the nanoparticles to each other and to the surface. Examples of "protected" nanoparticle chemistries include pretreated particles with Isocyanates which can be deposited to the surface and then deprotected (or activated) using heat to form a urethane bond to the surface. In another chemical system, nanoparticles are treated with a surface chemistry containing Biotin and are reacted with Avidin terminations. Other possible protected binary reactions would include Epoxides and Amines.

In the case of electrical connectors in particular, the durability of the texturized films is preferably low enough so one electrical conductor can cut through the texturized film on the other conductor. This allows the electrical conductors of the connectors to contact each other and to electrically communicate with each other. Low resistance connections between conductors can increase the battery life of portable electronic devices and the like.

FIG. 4 illustrates the durability of texturized films using a Hysitron scanning probe. Here, the surface of an AFM probe tip is scrubbed against a texturized film with a known force. In some embodiments of the invention, if the tested film is contacted with a force of about 10 μNewtons, then the film may not be stable enough. If the film is intact with a force with a force of 500 μN, then the film may be too durable to break through, depending on the specific application.

It is desirable to change the energy of the surface to be treated such that the critical energy is within a desired range, i.e., to provide a low surface energy coating. One way to do this is to expose the surface to be treated to long change hydrocarbons. Examples include but not limited to C8, C10, C11, C12, C14, and C18. Such long chain hydrocarbons may be derived from alkyl silanes (e.g., n-octyltriclohorosilane for C8). It is also possible to expose a surface to be treated to long chain fluorocarbons. Examples include FOTS FODCMS, or FDTS. Surface energy reduction can also be achieved with a wide variety of chemical treatments including the use of phosphonates or thiols. Alkyl-monomers and perfluoroalkyl monomers may be used to treat the surface, and may result in water contact angles greater than 135°. Ring structures, such as fluorinated or hydrogenated rings, may also be used like Pentafluorophenyl-trichlorosilane ($C_9H_6F_5Cl_3Si$).

Various methods may be used to apply materials to change the surface energy. One method is by the application of a self-assembling monolayer. Vapor application of a self-assembling monolayer is described in W. Robert Ashurst et al., *Journal of MicroElectroMechanical Systems*, Vol. 10, No. 1, March 2001 and W. Robert Ashurst et al., *IEEE Transactions on Device and Materials Reliability*, Vol. 3, No. 4, December 2003. See also R. Maboudian, *Surface Science Reports*, 30 (1998) 2007-269. Molecular Vapor Deposition (MVD®) of a self-assembling monolayer is described in B. Kobrin, et al., *SEMI Technical Symposium: Innovations in Semiconductor Manufacturing* (STS:ISM), 2004.

A preferred solution based process for forming a texturized film according to an embodiment of the invention may include first obtaining alumina powder. Alumina powder can be produced or purchased from a supplier such as Nanophase Technologies. The alumina powder may have particle sizes of about 40-60 nanometers and may have a surface area of about 32-40 $m^2$/gram.

After the alumina powder is obtained, about 40 mg of powder, for example, can be dispersed in 10 ml of methanol. An ultrasonic process can be used to ensure complete dispersion. Once dispersed, the solution can be sprayed onto a substrate to be treated at about 80° C. using a spray bottle or other spraying apparatus. Additional dilution of the stock solution with methanol or other solvent may be used to help control the thickness of the overall textured film being deposited. The resulting roughness of the film can be about 25 rms (nm), with coverage estimated at 25%. To improve the durability of the textured film, the surface to be treated can be exposed to bis-chlorosilane-ethane (vapor), before, after, or while the alumina particles are attached to the surface. The surface energy can be changed by exposing the surface to be treated with FDTS (vapor) or by a 0.5% solution of C18 in iso-octane.

A preferred vapor deposition process can use a vapor deposition chamber. Process conditions can include heating TMA to 50° C., which results in about 42 T of vapor pressure. Then, water is heated to 40° C., and a needle valve is adjusted so that the vapor pressure is about 55 Torr. Then, the substrate to be treated is exposed to the vapor of water and TMA sequentially for 15 seconds using an $N_2$ carrier gas (used in part for dilution). This water followed by TMA exposure can be repeated to increase the thickness. Then, the nano-particles are exposed to bis-chlorosilane-ethane (vapor) using a carrier gas. The injection process can be conducted for 30 seconds. Then, the surface energy can be changed with exposure to FDTS or FODCMS (vapor) using a carrier gas, again for 1 minute. Exposure to bis-chlorosilane-ethane increases the durability of the film as more links are created between the nano-particles.

In an alternative method for making the texturized film, it is possible to spray or shower the surface of a substrate with nano-particles. The nano-particles embed in the surface and dry leaving the desired texture (i.e., sand-blast roughening of the surface). A low surface energy coating is applied to the circuit board. Other process variations include the use of other linker chemistries such as those listed above.

Other chemistries can be used to lower the surface energy of a surface. Examples are provided in FIG. 5.

Embodiments of the invention preferably include a textured surface which has one or more, and preferably all, of the following properties:
a) Film Roughness: 25<RMS (nm)<500 (Average roughness)
b) Film Coverage: 25<Coverage (%)<60 (Average density)
c) Film Durability: 10<Force (μ-Newtons)<500 (Force)
d) Surface Energy: 0<Energy (Dyne/cm)<70 (Zisman Critical angle)

Figure 6:
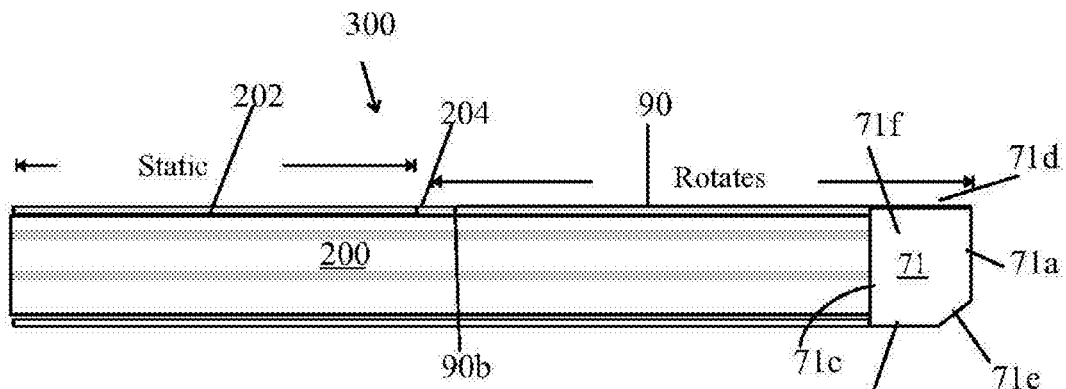
FIG. 6 shows a Venn diagram illustrating an intersection between preferred property ranges.

FIG. 6 graphically shows other ranges for the four textured film properties described above, when used to protect a printed circuit board or other type of electrical apparatus.

The film can have a thickness that is less than about 5000 Å or less than about 5 microns, and the film can be used to protect printed circuit boards and other electrical assemblies from ionic contamination.

Figure 7:
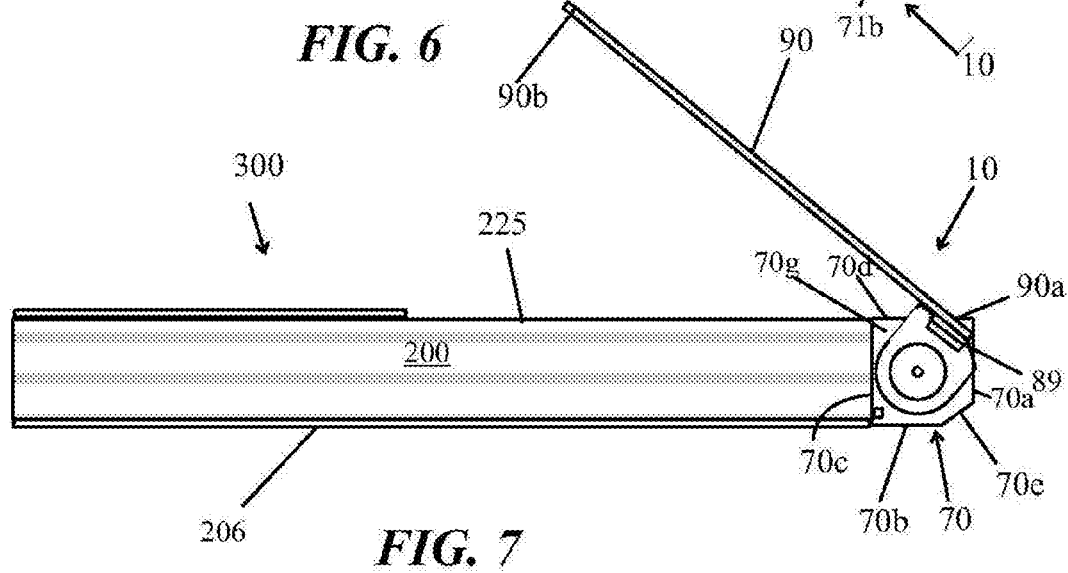
FIG. 7 shows a schematic of an apparatus that may be used to fabricate coatings.

FIG. 7 shows an apparatus that may be used to fabricate coatings. Other apparatus may also be used. The apparatus includes a chamber 710. A substrate holder 720 and gas dispersion rods 730 are disposed within the chamber. Gas dispersion rods 730 are connected to various material sources through valves and tubes. The material sources may be heated. A heated stainless steel cylinder containing the precursor source 740, and a source of nitrogen carrier gas 741 are connected to a gas dispersion rod 730 by tubes 742 and valves 743. A heated water source 750, and a source of nitrogen carrier gas 751 are connected to a gas dispersion rod head 730 by tubes 752 and valves 753. A heated first precursor source 760, and a source of nitrogen carrier gas 761 are connected to a gas dispersion rod 730 by tubes 762 and valves 763. A heated second precursor source 770, and a source of nitrogen carrier gas 771 are connected to a gas dispersion rod 730 by tubes 772 and valves 773. The specific material sources illustrated in FIG. 7, including the carrier gas source, are by way of example, and other material sources may be substituted or added. A vacuum pump 780, in conjunction with tubes 781, valves 782, filter 783 and manometer 784 are also connected to chamber 710, and may be used to control the pressure within chamber 710 and to remove reaction byproducts and excess reagents from chamber 710. The apparatus of FIG. 7 is particularly well suited for wet methods for obtaining a film with a nano-structure.

A coating may be fabricated by placing a substrate, including an electronic device or the like, to be coated on substrate holder 720. The substrate may be exposed to various materials in desired combinations and/or sequences in a controlled manner by operating the valves of the apparatus of FIG. 7.

An in-line continuous spray system may also be used for wet methods for obtaining a film with a nano-structure. In that type of system, a substrate on a conveyor apparatus is passed sequentially under a number of shower heads or similar spray apparatus, and is exposed to different materials or combinations of materials by each shower head. Commercial spray coating equipment is available for Asymtek (www.asymtek.com), (www.asymtek.com), PVA (www.pva.net) or Ultrasonic Systems (www.ultraspray.com).

Figure 8:
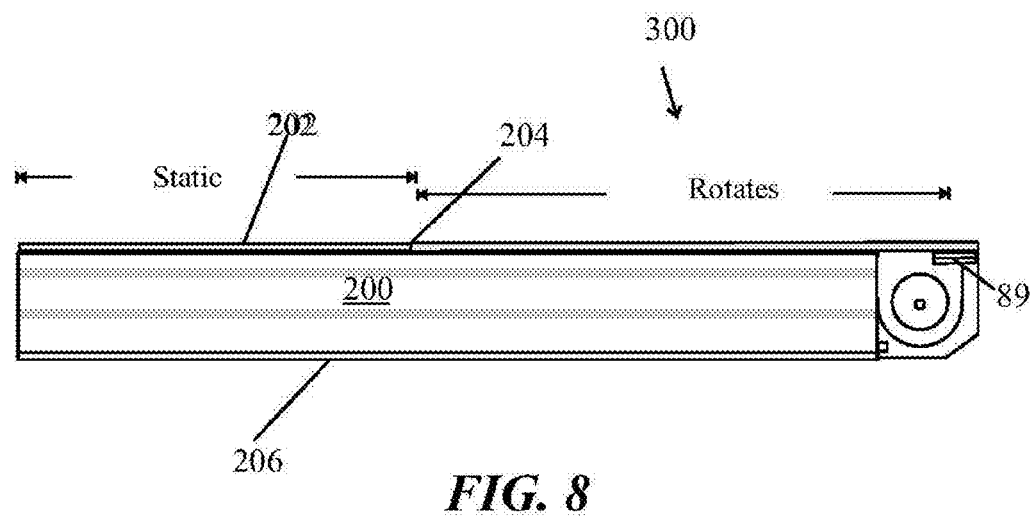
FIG. 8 shows an apparatus that may be used to fabricate coatings.

FIG. 8 shows an apparatus that may be used to fabricate coatings. Other apparatus may be used. The apparatus includes a chamber 810. Chamber 810 includes inlet tubes 820 through which gas may be introduced into chamber 810. Inlet tubes 820 may be connected to various material sources using connections know to the art. Chamber 810 may be subjected to a vacuum using apparatus and techniques known to the art. The apparatus of FIG. 8 is particularly well suited for vapor deposition methods for obtaining a film with a nano-structure.

Some desirable terms may include the following.

Film coverage definition: using a digital map to represent the surface topography and surface density. As quantified herein for purposes of defining which films have sufficient coverage, a digital map similar to that shown in FIG. 2 may be generated for any given surface. These areas are shown, for example, as black in FIG. 2. Thus, a surface having few large protrusions may have a surface roughness similar to that of a surface having many smaller protrusions, but the surface with many smaller protrusions may have a significantly greater coverage, as illustrated in FIG. 2.

IMAGE.J Software (versions 1.38) was used for computing the digital surface coverage. ImageJ is a public domain, Java-based image processing program developed at the National Institutes of Health and is available on the internet. The source code has been published by the NIH.

The following procedure was used to compute the digital surface coverage.

1) Take the SEM image
2) Open the image file in Image J software
3) Set scale in Image J to match with scalebar (this allows for calculation of sizes in actual physical units, as opposed to pixels)
4) Convert the image to binary. The surface roughness now shows as black . . . everything else is white.
5) Select the region of the image that includes everything above the scale bar (including the scale bar will cause erroneous calculations). Analyze the area—this represents the total surface area (Call this number "A")
6) Analyze particles, from 0 to infinity size. This counts all particles, and calculates their individual areas. Copy and paste the results into Excel.
7) Add up all the areas of the particles. Call this number "B"
8) "B/A" represents the fraction of the total surface that is occupied by particles.
9) The threshold is set using the publish Isodata Algorithm [T. W. Ridler, S. Calvard, Picture thresholding using an iterative selection method, IEEE Trans. System, Man and Cybernetics, SMC-8 (1978) 630-632.] which is included in the version 1.38 software package. In the Isodata Algorithm, the procedure divides the image into objects and background by taking an initial threshold, then the averages of the pixels at or below the threshold and pixels above are computed. The averages of those two values are computed, the threshold is incremented and the process is repeated until the threshold is larger than the composite average.

Film Durability: The film is subjected to testing in a Hysitron scanning probe. A pyramid-shaped Berkovich probe tip having a 150 nm radius with a controlled reciprocating scratch with 100 cycles, a length of 3 µm, at a rate of four seconds is applied to the film. The normal load for these tests was 10 to 500 µN. A profile map of the scanned area shows if the film is still present or is removed. Films which were removed with a 10 µN load were observed to lack coherence. These films could be easily removed or "blown away" or would be removed by gravity. Films which were still present with a 500 µN force are very durable and would not be removed from a connector surface under normal contact pressures which would lead to electrical conduction issues.

This texturized surface or conformal coating can include any non-conductive material. Such materials include metal oxides such as (aluminum oxide, titanium oxide, and silicon oxide). Other materials may include organic latex spheres or other media. A conformal coating with the above-described properties can suppress electrical leakage from circuit leads by creating an ionic barrier.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents. For example, while some examples may be given with respect to a particular device or substrate, One or more features from any embodiment may be combined with one or more features of any other embodiment without departing from the scope of the invention.

A recitation of "a", "an" or "the" is intended to mean "one or more" unless specifically indicated to the contrary.

All patents, patent applications, publications, and descriptions mentioned above are herein incorporated by reference in their entirety for all purposes. None is admitted to be prior art.

EXPERIMENTAL

For a Vapor deposition coating process: Nano-particles were created using chemical reactions which consist of two self-limiting process steps. The use of sequential chemical reactions ensures the proper reaction at the surface. For alumina particles, the overall reaction is.

$$2Al(CH_3)_3 + 3H_2O \rightarrow Al_2O_3 + 6CH_4$$

The two self-limiting process steps, which are surface reactions, are:

$$2AlOH + 2Al(CH_3)_3 \rightarrow 2[Al-O-Al(CH_3)_2] + 2CH_4 \quad \text{Surface Reaction \#1}$$

$$2[Al-O-Al(CH_3)_2] + 3H_2O \rightarrow Al_2O_3 + 2AlOH + 4CH_4 \quad \text{Surface Reaction \#2}$$

To impart durability into the film, a bi-functional linker is applied to the particles. By introducing more linking agents, the cohesion between the nano-particles is increased. To impart super-hydrophobic qualities to a surface, we then apply an organosilane-based self-assembled monolayer (SAM) that forms a covalent bond nano-structure.

An example of an ALD process recipe is shown below in Table 3. The value of "1" indicates that the valve in the corresponding vacuum diagram (FIG. 7) is open.

TABLE 3

| Note | Step | Time | Gas 1 | N2 1 | Gas 2 | N2 2 | Gas 3 | N2 3 | Gas 4 | N2 4 | Slow ISO | ISO | Vent |
|---|---|---|---|---|---|---|---|---|---|---|---|---|---|
| Pump Down | 1 | 60 | | | | | | | | | | 1 | |
| Particle-Set-Up #1 | 2 | 5 | | 1 | | | | | | | | 1 | |
| Water Injection | 3 | 15 | 1 | 1 | | | | | | | | | |
| Purge #1 | 4 | 10 | | 1 | | | | | | | | 1 | |
| Metal Precursor Setup | 5 | 5 | | | | | | 1 | | | | 1 | |
| TMA Injection | 6 | 15 | | | | | 1 | 1 | | | | | |
| React #1 | 7 | 15 | | | | | | 1 | | | | 1 | |
| Particle-Set-Up #2 | 8 | 5 | | | 1 | | | | | | | 1 | |

TABLE 3-continued

| Note | Step | Time | Gas 1 | N2 1 | Gas 2 | N2 2 | Gas 3 | N2 3 | Gas 4 | N2 4 | Slow ISO | ISO | Vent |
|---|---|---|---|---|---|---|---|---|---|---|---|---|---|
| Water Injection | 9 | 15 | 1 | 1 | | | | | | | | | |
| Purge #2 | 10 | 10 | | 1 | | | | | | | | 1 | |
| Metal Precursor Setup | 11 | 5 | | | | | | 1 | | | | 1 | |
| TMA Injection | 12 | 15 | | | | 1 | | 1 | | | | | |
| React #2 | 13 | 15 | | | | | | 1 | | | | 1 | |
| Linker Treatment | 14 | 5 | | | | 1 | | | | | | 1 | |
| Linker Chemistry Injection | 15 | 30 | | | 1 | 1 | | | | | | | |
| Purge #4 | 16 | 10 | | | | | | | | | | 1 | |
| Reaction | 17 | 60 | | | | | | 1 | | | | 1 | |
| Set-Up Surface Treatment | 18 | 5 | | | | | | | | 1 | | 1 | |
| Surface Treatment Injection | 19 | 60 | | | | | | | 1 | 1 | | | |
| Reaction | 20 | 60 | | | | | | | | | | | |
| Purge | 21 | 30 | | | | | | | | | | 1 | |
| Chamber Vent | 22 | 260 | | | | | | | | | | | 1 |

Alternatives to the process include increasing or decreasing the times of the chemical injection times. The water injection time (Step #3 and Step #9 in the above Table) can vary from 1 to 30 seconds. The TMA or precursor injection time (Step #5 and Step #12) can vary from 1 to 30 seconds. The purge times (Step #4, Step #10, Step #16, Step #21) can be increased to decreased to control the mixing of the residual vapors. As the purge time is increased, the concentration of the adsorbed vapors onto the surface is reduced which reduces the surface reactions and the number of nano-particles. The above reaction was performed at pressure between 1 torr to 100 torr. The temperature of the reaction was performed at 35 C. By controlling the temperature, pressure, time, and the timing sequence, the size and number of nano-particles can be influenced. The timing and order of the linker chemistry injection will affect the durability of the nano-composite produced.

For a wet spray process: Alumina oxide particles with a surface area of 3-5 meter$^2$/gram and with a particle size distribution between 40 to 60 nm were commercially purchased. A solution of consisting of 40 mg of alumina powder was added to 10 ml of methanol. The solution was sonicated to insure complete dispersion. The solution was sprayed onto the substrate @80° C. using a artist airbrush. Additional dilution of the stock solution with methanol or other solvent can help control the thickness of the overall textured film being deposited. Improve durability with exposure to Bis-Chlorosilane-ethane (vapor). Change surface energy with exposure to FDTS (vapor) or C18 in a solution of iso-octane or hexane.

Example 1

In FIG. 4A, the recipe shown in Table-3 using steps 1 through 13, 18 through 22 were used. The surface treatment chemistry in Step #19 was FDTS. A wear load of 10 μN was applied. The AFM image shows that the nano-particles (texture) were pushed around indicating the particles were loosely coherent or just laying on the surface. In FIG. 4B, the deposition recipe shown in Table-3 using steps 1 through 22 were used. The linker chemistry in Step #15 was Bis-trichlorosilane-Ethane and the surface treatment chemistry in Step #19 was FDTS. A wear load of 10 μN was used. The nano-particles were adherent of the surface and were not pushed around by the loaded stylist. In FIG. 4C, the recipe shown above using steps 1 through 22 were used expect the wear load was increased to 50 μN. The process recipe used for FIG. 4B was used. The nano-film was completely removed.

Example 2

Figure 9:
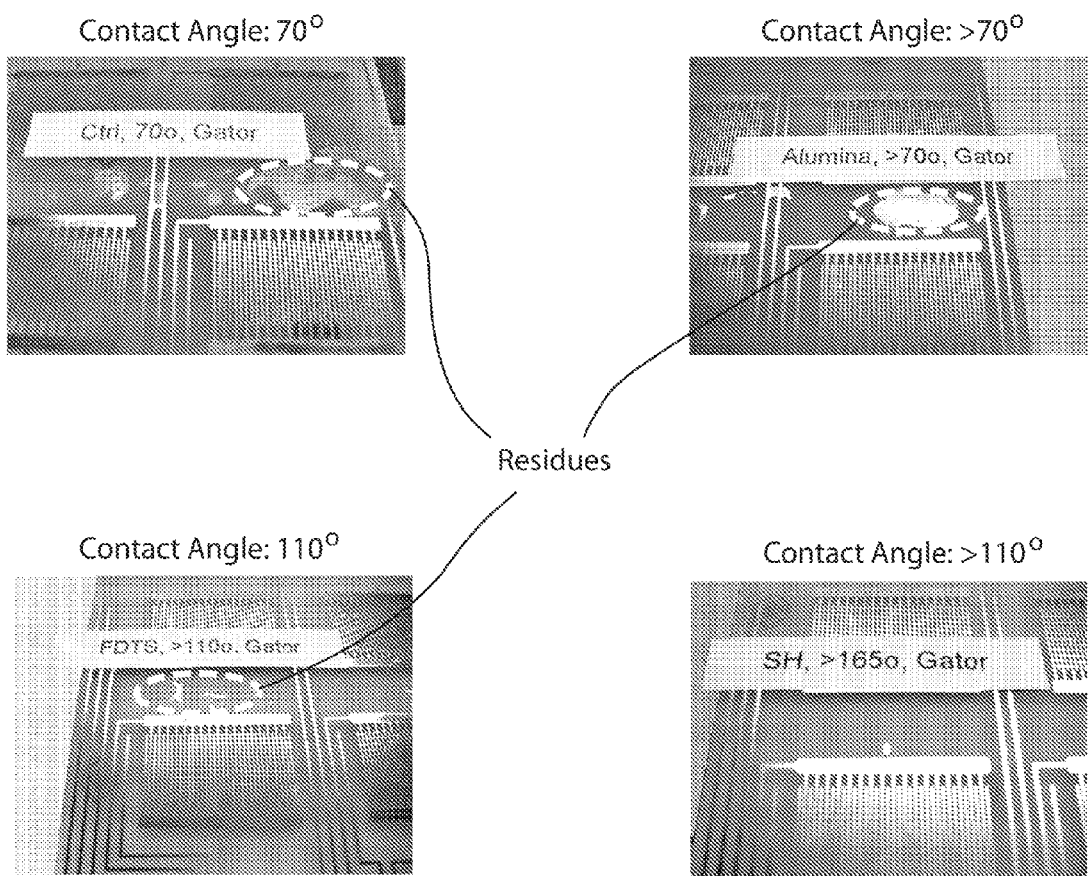
FIG. 9 shows printed circuit boards with various coatings after exposure to an ionic solution.

A printed circuit board with various coatings are shown in FIG. 9. The circuit boards consists of an inter-digitated comb structures specifically designed for testing reliability after a high temperature bake. The test boards were exposed to Gatorade®, which is an ionic solution that includes potassium phosphate and citric acid. The contact angle of the Gatorade® on each coating was measured by using a Rame-Hart Goniometer. Contact angles were as follows: Example 1A, 70°; Example 1B, 70°; Example 1C, 110°; Example 1D, >165°.

Example 2A

A printed circuit board of Example 2 shown in FIG. 9 consists a inter-digitated comb structures used for testing reliability was provided, without any treatment. When the board is exposed to Gatorade®, the surface wets and dries with a potassium phosphate/sugar residue. These residues result in leakages between the inter-digitated surface wiring of the printed circuit board.

Example 2B

The printed circuit board of Example 2 was coated with alumina particles having a diameter of approximately 40 to 60 nm. The coating was performed via by a process of TMA and Water with a recipe shown in Table 3 using steps 1 through 13. The contact angle of a Gatorade® solution was ~70 degrees. The solution adheres to the surface and dries with a residue.

Example 2C

A printed circuit board similar to Example 2A but subsequently coated with a hydrophobic coat of FDTS (Step #19) with a recipe shown in Table-3 using steps #18 through #22. The contact angle of a Gatorade® solution was ~110 degrees. The Gatorade® solution would "bead-up" in clumps but when dried, residues were still observed.

Example 2D

The printed circuit board Example 2A was further treated by applying alumina particles using a CVD reaction of TMA and Water (Table #3, Steps #1 to Step #13) followed by a surface treatment of FDTS (Steps #18 to #22). The Gatorade® contact angle was >165 degrees. The surface does not wet and no residues were observed. No electrical leakage could be measured using a resistance Ohm meter.

Example 3

Several samples were prepared by depositing alumina particles over a 50×50 micron square and then treating with FODCMS. These samples show how surface roughness and low surface energy add to anti-wetting properties and ionic contamination control.

Example 3A

Alumina particles having a diameter of 40 to 60 nm were deposited over a Silicon substrate by a recipe shown in Table 3. BCTSE was used as the linker agent in Step #15 and FODCMS was used as a low surface energy coating in Step #19. The resultant film is illustrated in FIG. 10A, and was measured as having an average roughness of 9.63 nm., an RMS roughness of 15.66 nm and a ten points height of 280.72 nm. A water contact angle of 130° was observed.

Example 3B

A sample was prepared using a method similar to that of Example 3A, except the water injection time was increased two times. The resultant film is illustrated in FIG. 10B, and was measured as having an average roughness of 31.62 nm., an RMS roughness of 40.77 nm, and a ten points height of 393.54 nm. A water contact angle of 140° was observed. As the surface roughness increases, the contact angle increased.

Example 3C

A sample was prepared using a method similar to that of Example 3A, except the water injection was increased 4 times. The resultant film is illustrated in FIG. 10C, and was measured as having an average roughness of 43.43 nm., an RMS roughness of 55.17 nm, and a ten points height of 485.04 nm. The water contact angle of >165° was observed. When the surface roughness increased further, the anti-wetting properties were observed.

Example 4

Example 4 shows a USB 512 MB memory, both uncoated and coated. FIG. 11A shows the USB 512 MB memory having a 1500 micron pitch and 500 micron spacing between the leads. If the film thickness plus the film's roughness is greater than ½ the distance between the spacing, there is a potential for electrical shorting. Thus the film thickness is preferably much less than the spacing between the minimum features size.

Example 4A

Gatorade® was applied to the USB 512 MB memory as received. A water contact angle of <40° was measured. FIG. 11B shows the uncoated USB 512 MB memory at a greater magnification than that of FIG. 11A. Gatorade® completely wets the electrical circuit and any residuals between the electrical leads from a drying solution could potential cause leakage pathways.

Example 4B

A USB 512 MB memory was treated per the recipe of Table 1 Steps #1 to 22. The linker chemistry in Step #15 was Bis-trichlorosilane-ethane and the surface treatment chemistry in Step #19 was FDTS. The alumina nano-particles were ~40 µm-60 µm in size. A water contact angle of >165° was measured. FIG. 11C shows the coated USB 512 MB memory at the same magnification as that of FIG. 11B. The coating is not visible. No liquids were observed to adhere to the surface and accumulated on the surface or between electrical leads.

Example 5

Several samples were prepared, each using the same alumina particles, linker molecules, and low surface energy coating. The linker chemistry was Bis-Trichlorosilane-ethane and the surface treatment chemistry was FODCMS. The differences were in the parameters used to deposit the alumina particles, resulting in different surface roughnesses.

Example 5A

The deposition parameters were similar to Table 3. The result is shown in FIG. 12, and has a RMS surface roughness of 15 nm. A water contact angle of 130° was observed. FIGS. 12A, 12B, 12C and 12D are the same sample at different magnifications, ×2,700, ×3,500, ×20,000 and ×65,000 respectively.

Example 5B

The deposition parameters were similar to Table 3 but the water vapor injection time during the coating process was increased by 2 times. The result is shown in FIG. 13, and has a RMS surface roughness of 55 nm. A water contact angle of >160° was observed. FIGS. 13A, 13B, 13C and 13D are the same sample at different magnifications, ×2,700, ×3,500, ×20,000 and ×65,000 respectively. The increased surface roughness and density can be observed.

Figure 14:
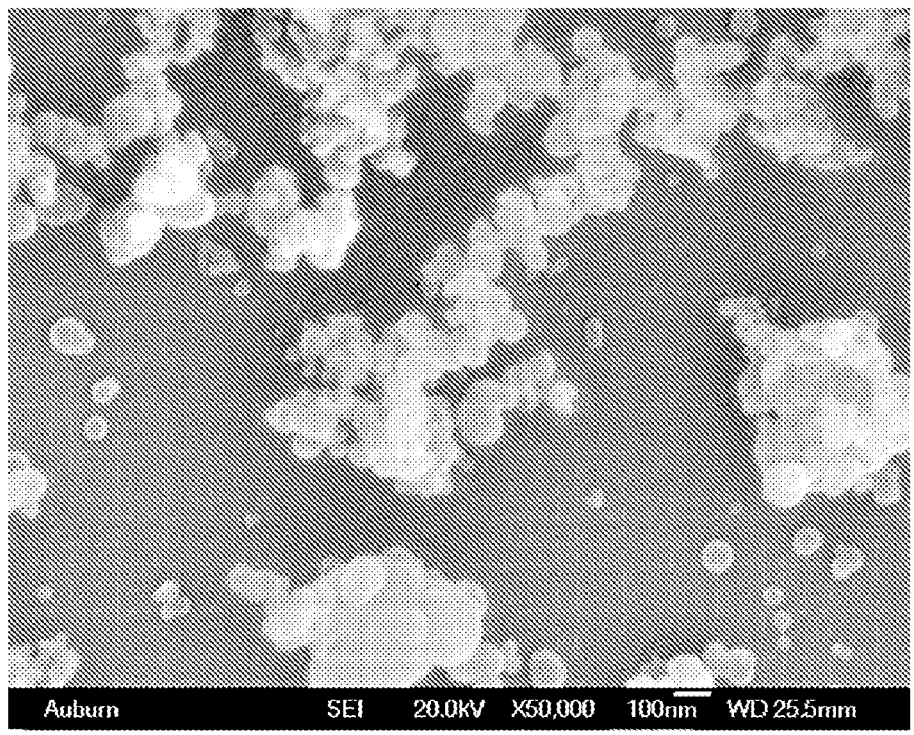
FIG. 14 shows several scanning electron micrographs (SEM) of a cross section of a sample similar to that illustrated in FIG. 13.
Figure 1:
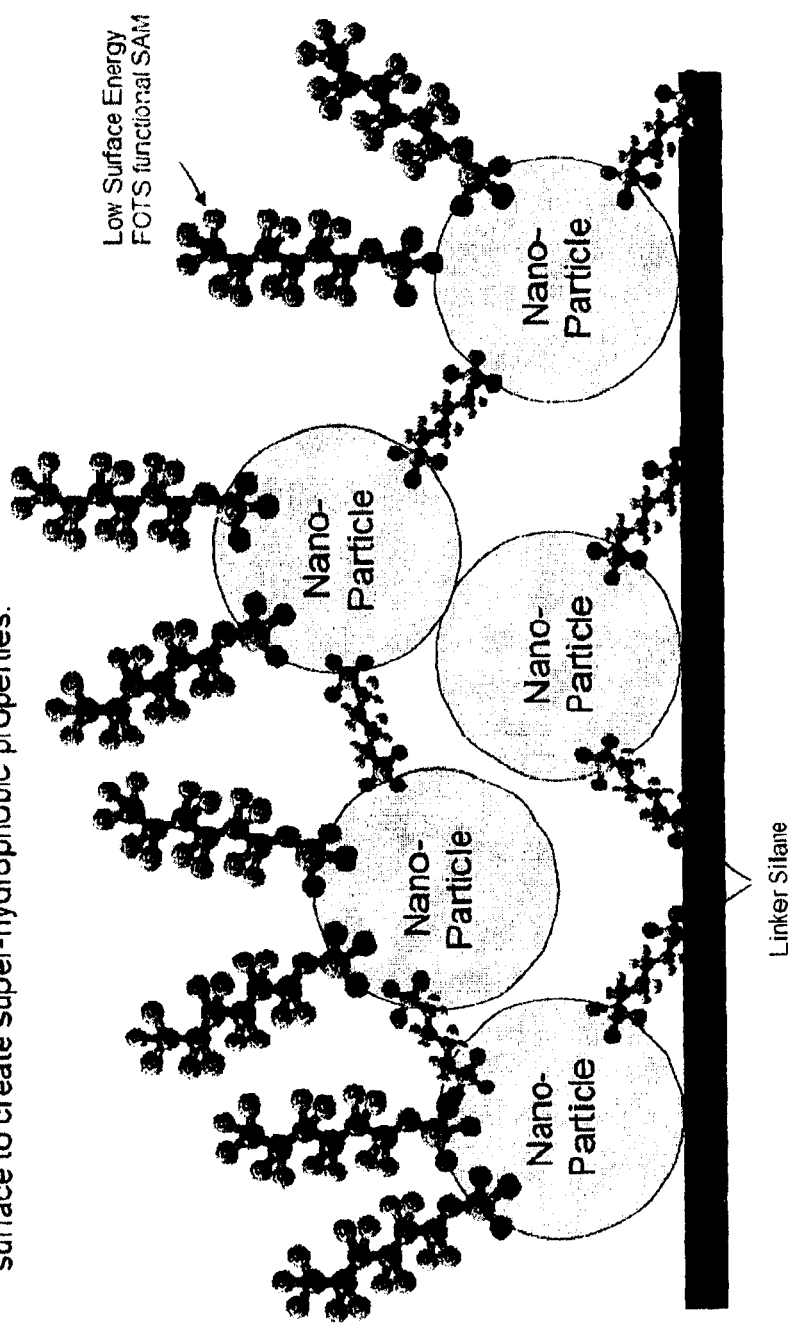
Figure 2:
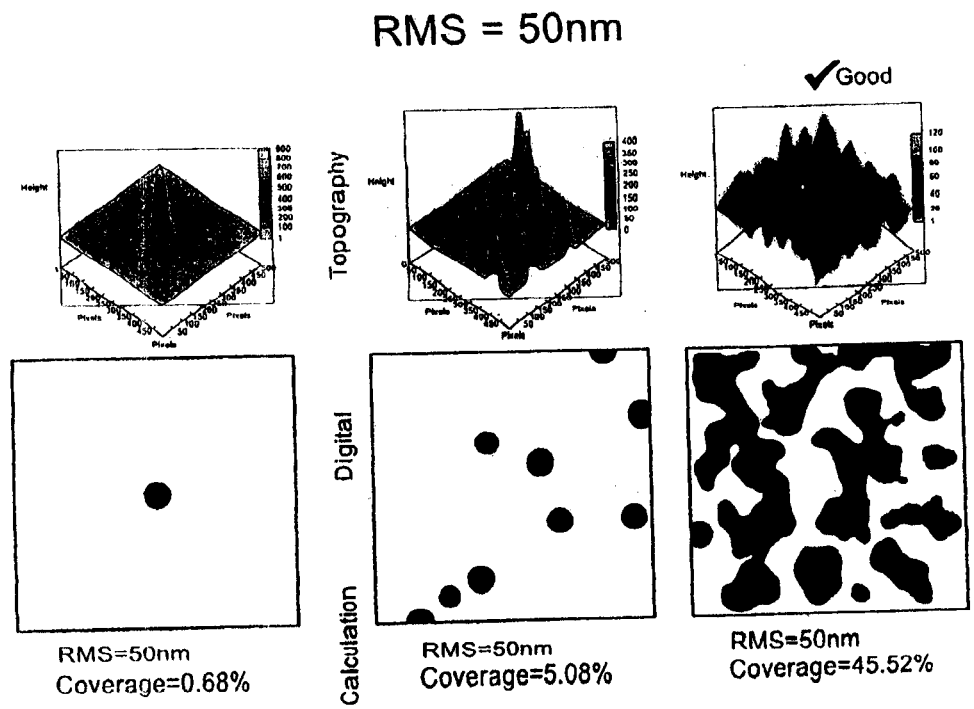
Figure 6:
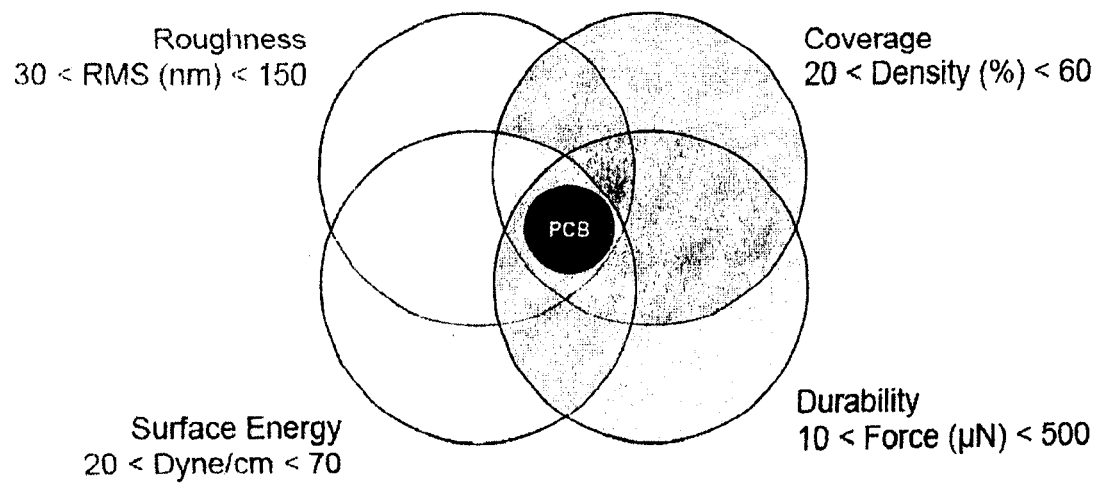
Figure 7:
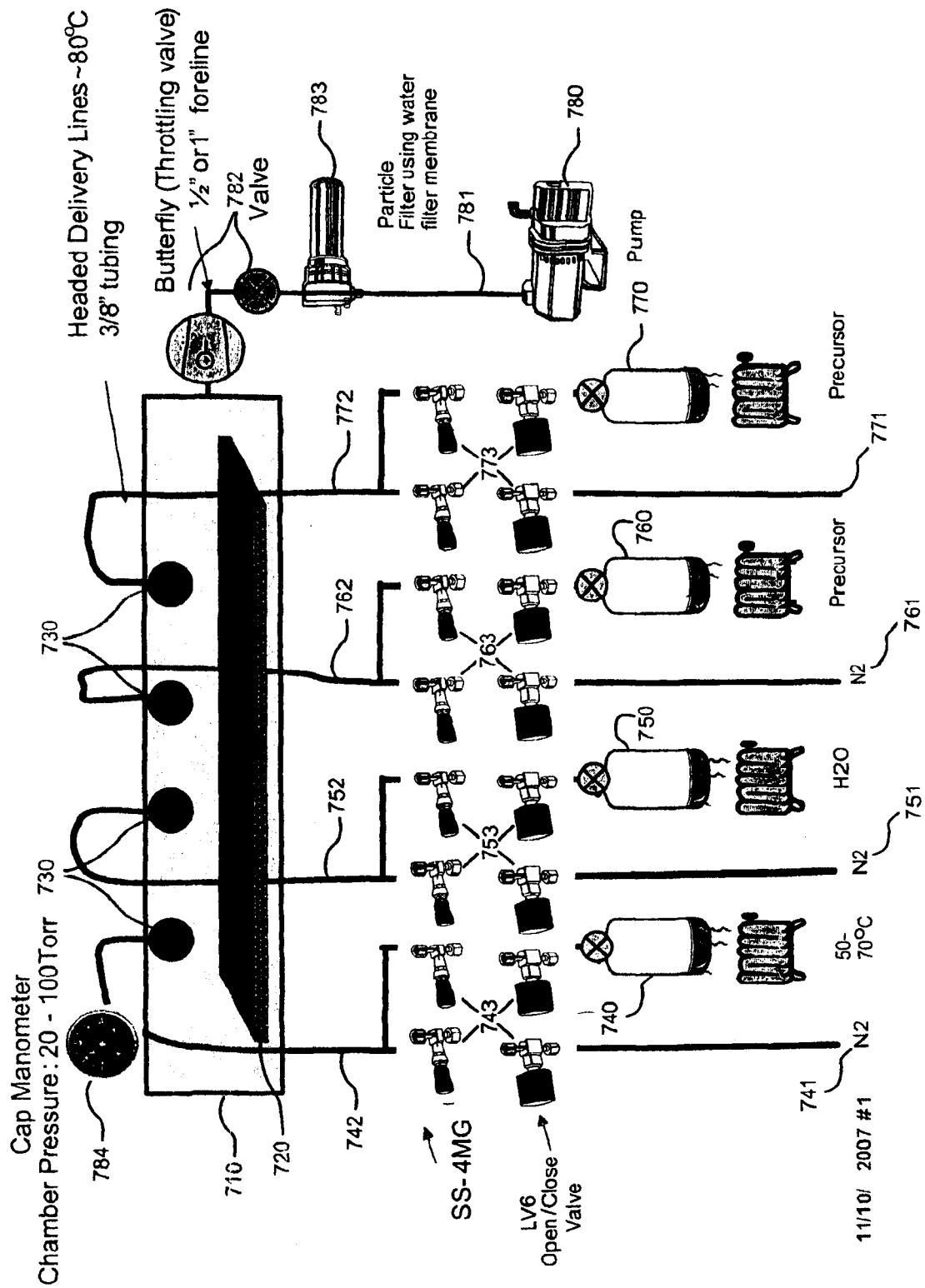
Figure 8:
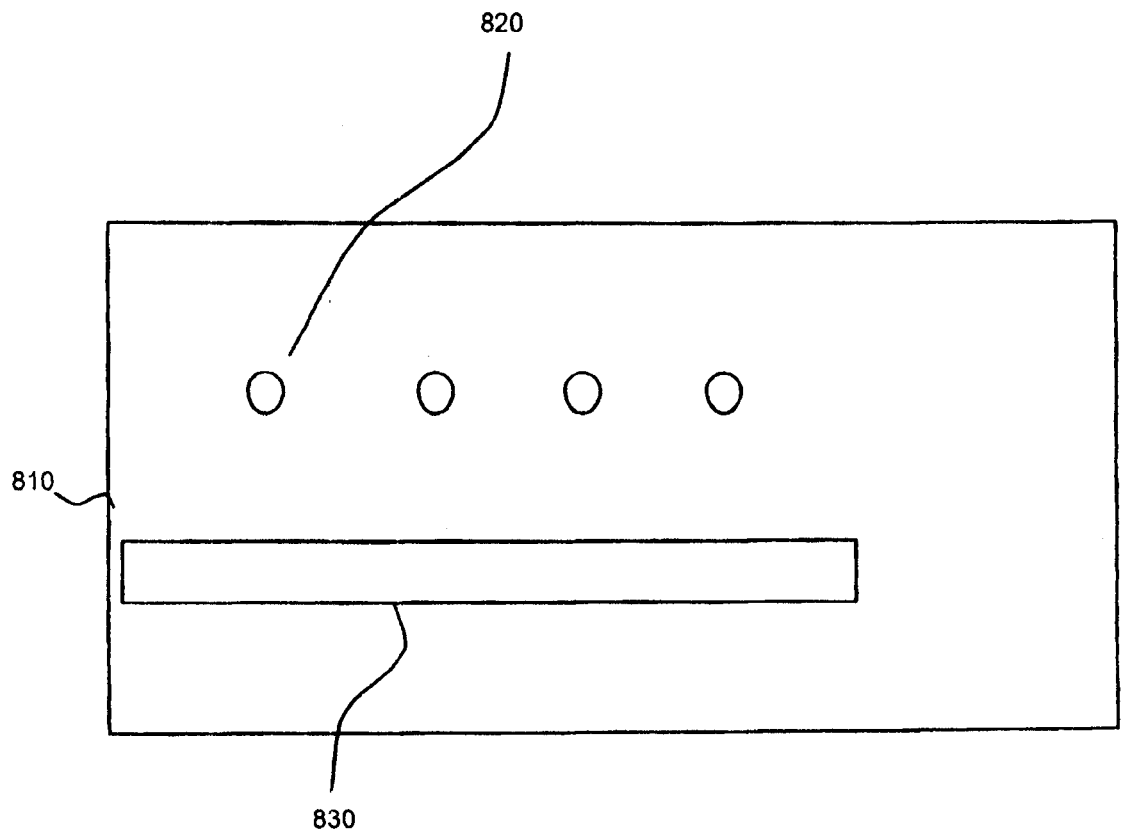
Figure 9:
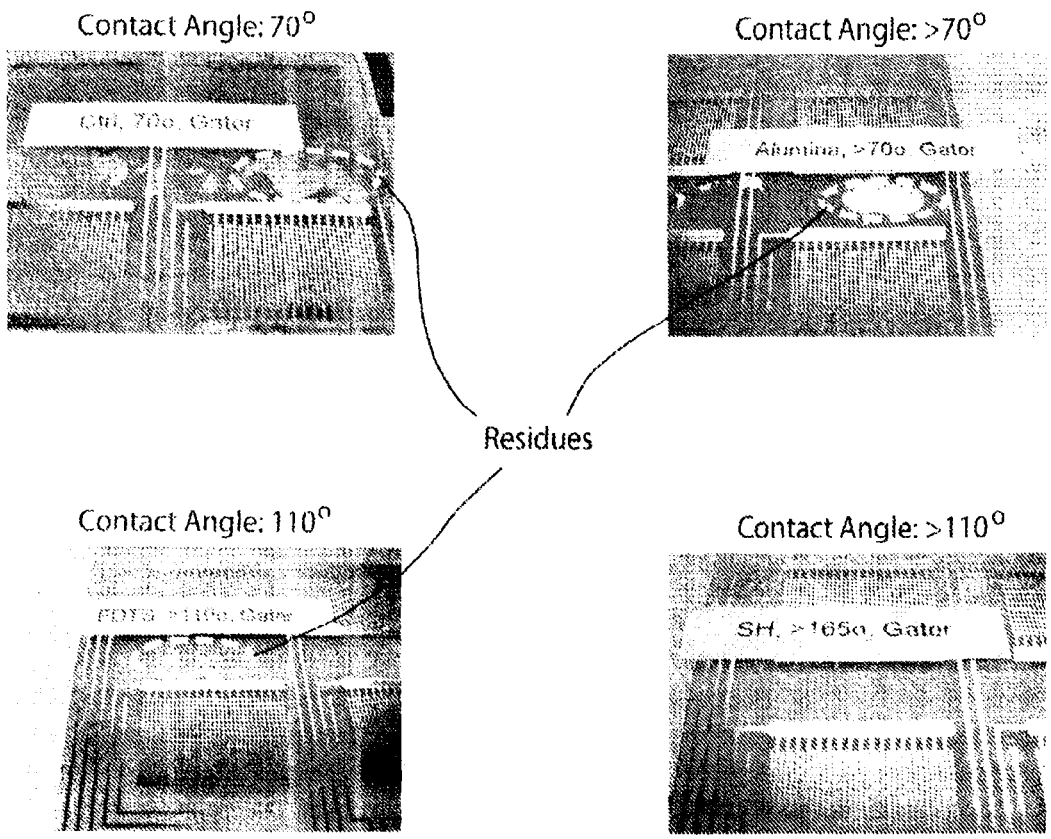
Figure 14:
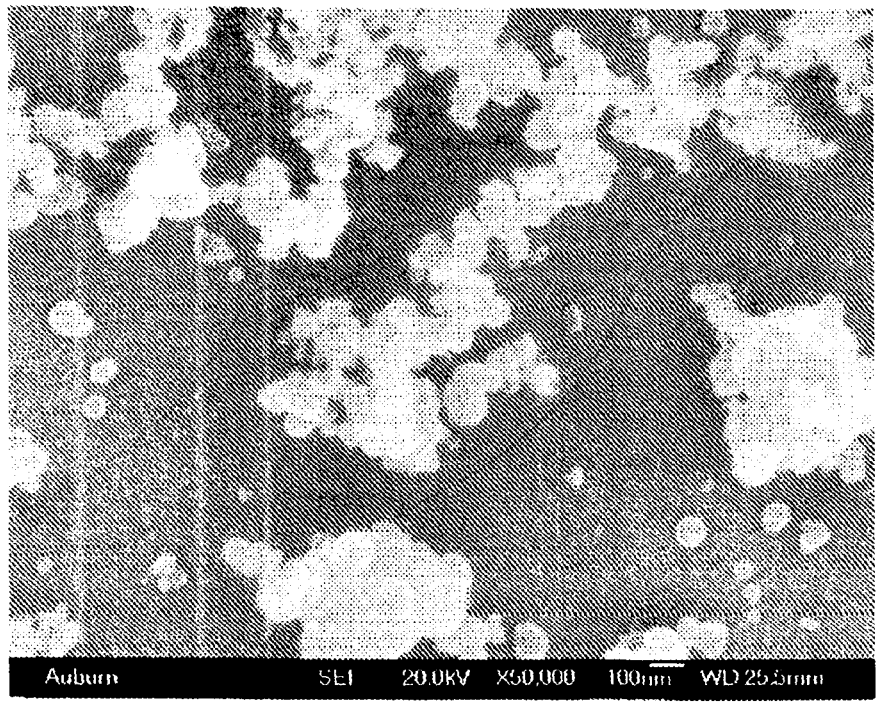
Figure 1:
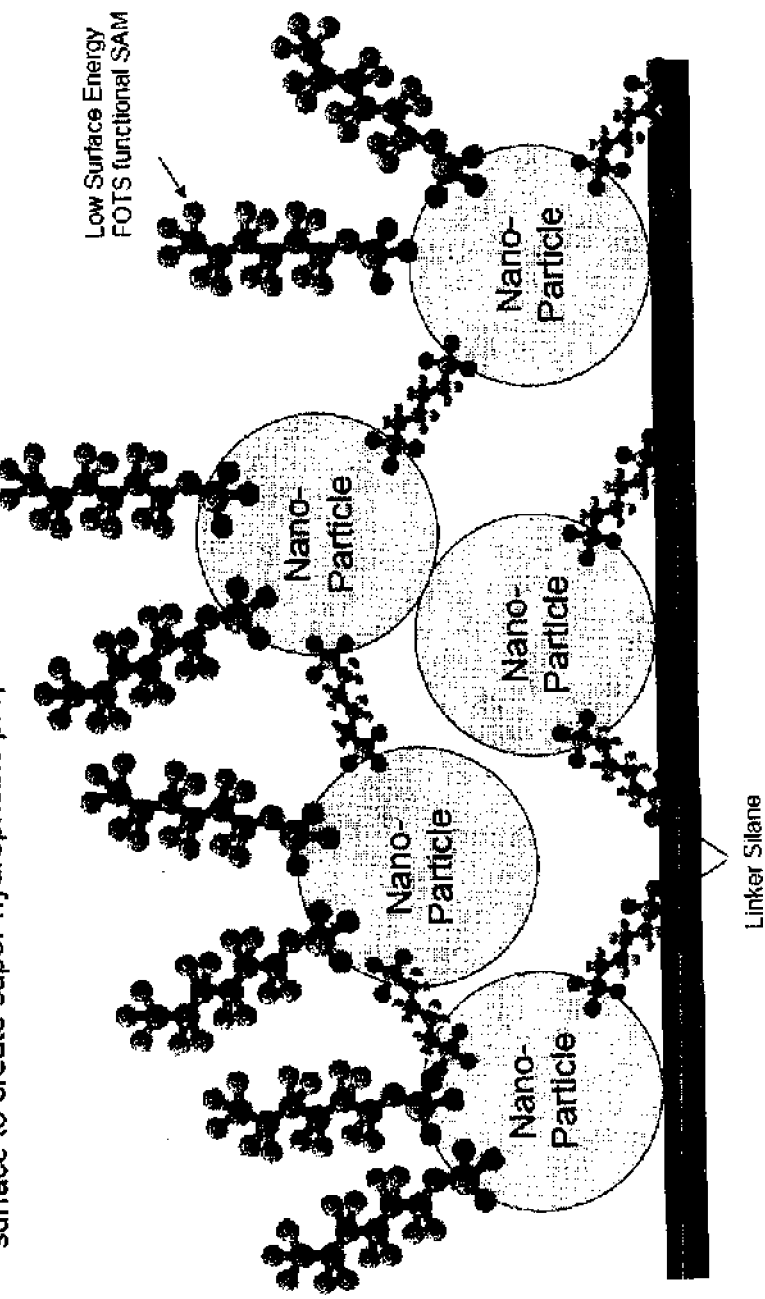
Figure 2:
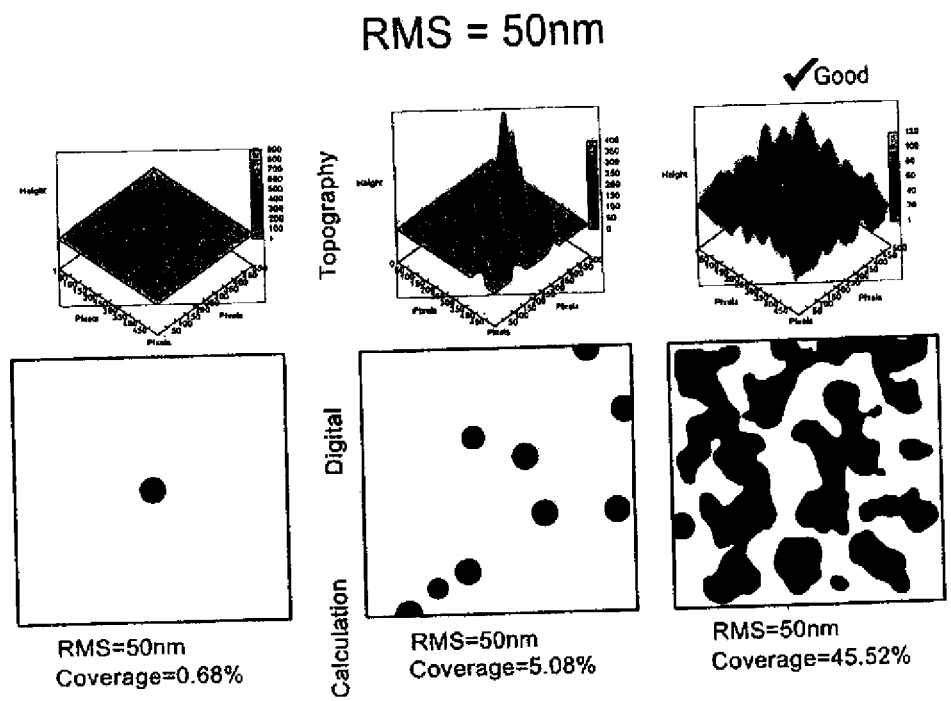
Figure 6:
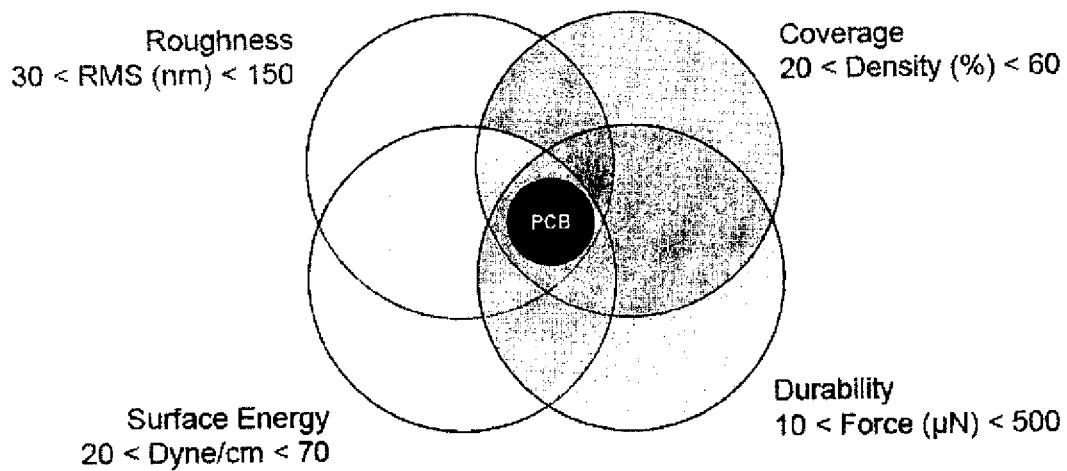
Figure 7:
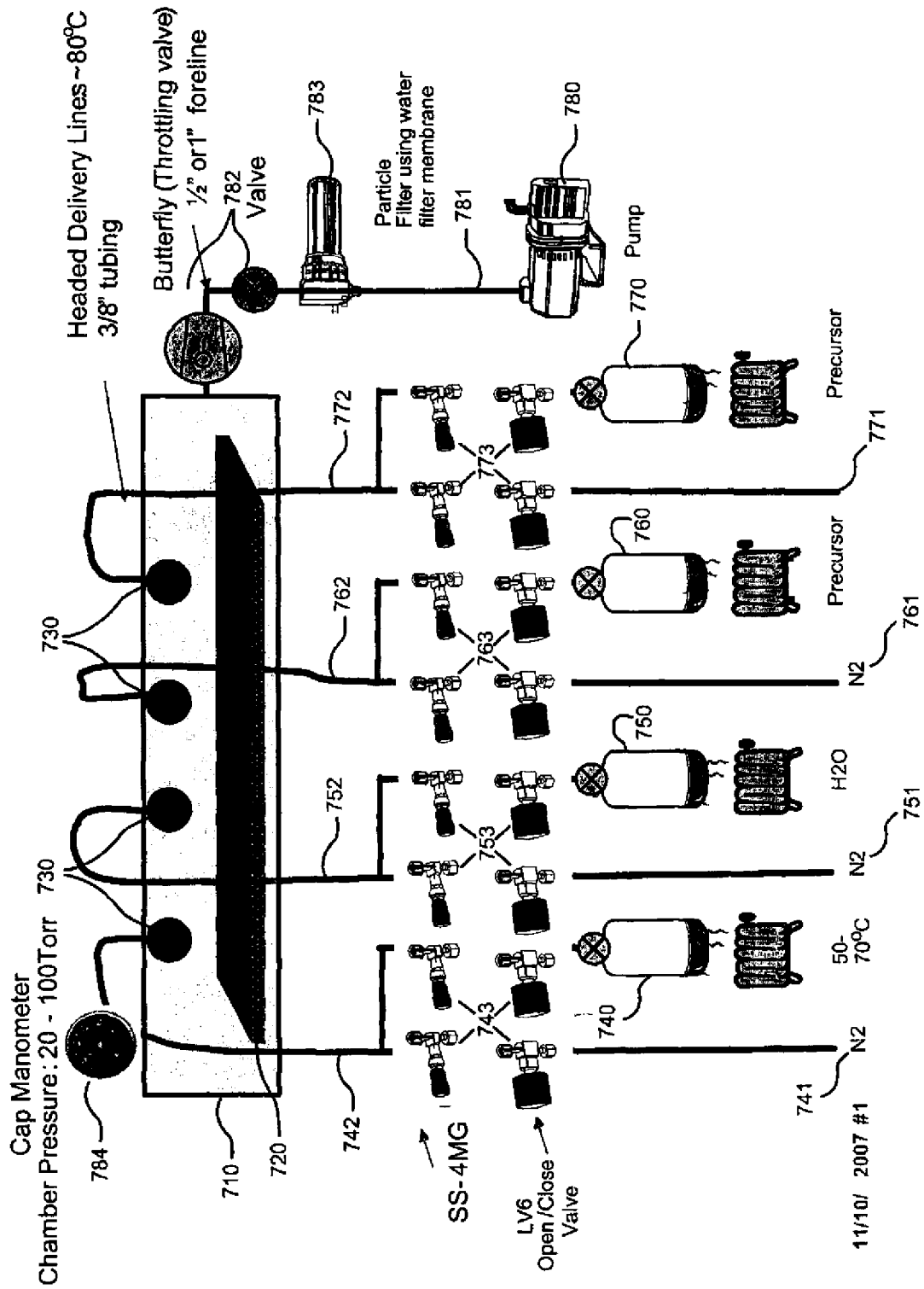
Figure 8:
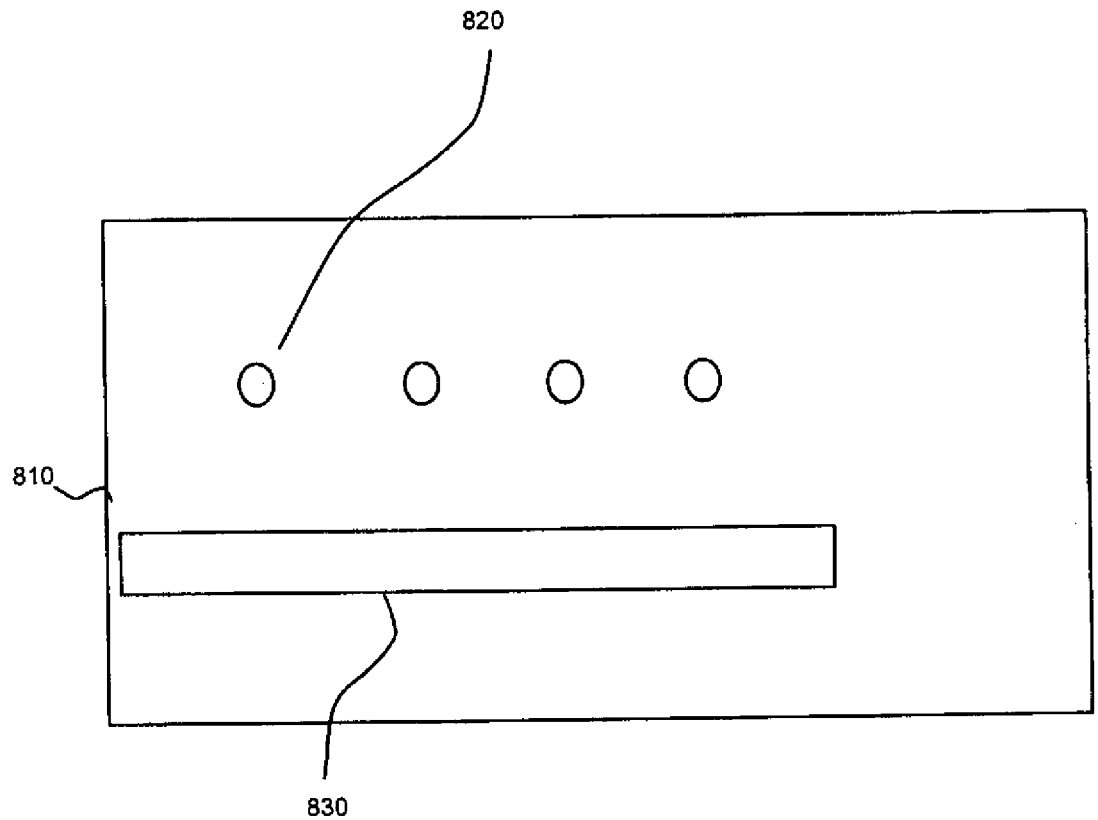
Figure 9:
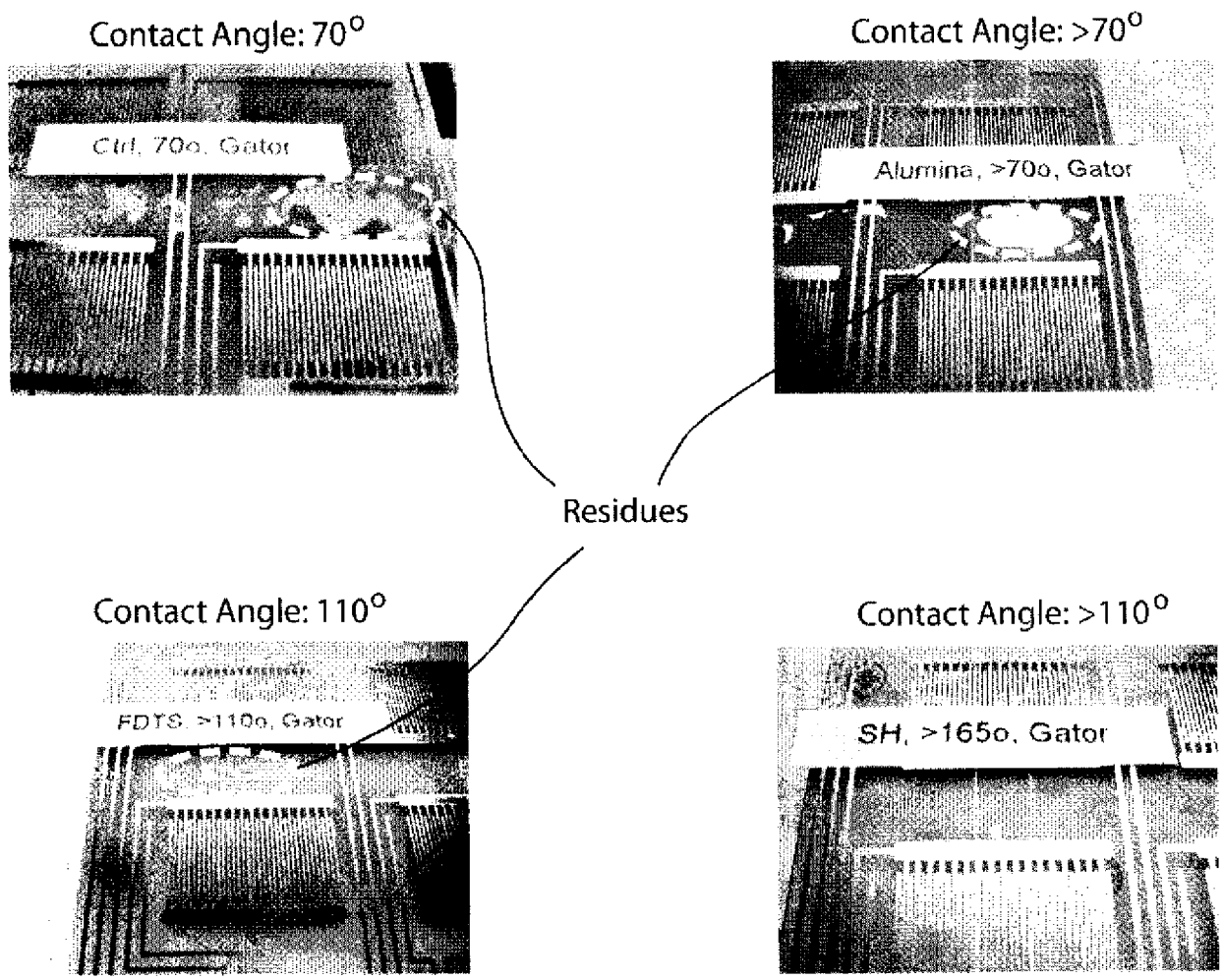

FIG. 14 shows a scanning electron micrograph (SEM) of a cross section of a sample similar to that illustrated in FIG. 13.

Example 6

Critical surface tension was measured from four (4) different surface coatings used to reduce the surface energy. The measurement was performed by depositing a layer of the material on a polished silicon surface. Table 2 shows the results. The "Contact Angle" was measured using DI water. The contact angle was also measured on alumina particles and measured it the resulting contact angle was greater than 135 degrees. It was observed that if the critical surface tension was >75 Dyne/cm, a contact angle greater than 135 degrees could not be achieved and the film did not exhibit an ionic barrier.

TABLE 2

SURFACE ENERGY WITH ROUGHNESS

| Chemistry | Critical Surface Tension* | Contact Angle > 135° | Does it Work? |
| --- | --- | --- | --- |
| DDMS (Dichlorodimethylsilane) (Hydro-carbon) | >75 dyne/cm | NO | NO |
| FDTS (Perfluoronated) | 15-20 dyne/cm | YES | YES |
| OTS (C18) (Hydro-carbon) | 20-25 dyne/cm | YES | YES |
| Octyl-silane (C8) (Hydro-carbon) | 25-35 dyne/cm | YES | YES |

*Critical Surface Tension measured on polished silicon surface

Example 7

A protective film was formed by a wet process as shown in FIG. 15.

First, a silicon substrate was sprayed with a mixture of alumina particles about 40 nm in diameter, suspended in methanol and water, 0.5 wt % alumina in a solution of 1000 (volume) methanol:100 (volume) water. The surface was heated to 80° C. during the spray using an artist airbrush. The surface in FIG. 15B was subsequently treated with Bis-trichlorosilane-ethane vapor coating followed by C18 in a solution. The final surface had a RMS surface roughness of 25 nm, and a contact angle of about 135° for water.

Example 8

Films with improved durability were formed by exposing the nano-particles to a linker chemistry.

Example 8A

A film was formed by a process similar to Example 7. The film was subjected to a mechanical scratch test by sliding the surface of Teflon tweezers over the substrate. The result is illustrated in FIG. 15A, showing that the film was removed where scratched.

Example 8B

A film was formed using a process similar to that of Example 8A, except nano-particles are exposed to Bis-Trichlorosilane-Ethane after the formation of the nano-particles onto the surface and before the surface treatment. The film was subjected to the same scratch test described in Example 8A. The result is illustrated in FIG. 15B, showing an improved film durability.

Example 9

A sample was prepared using a method similar to that described in Table 3.

Example 9A

The resultant film is illustrated in FIG. 3A (a SEM photograph) and FIG. 3B (a digitized image showing black where film roughness protrudes from the surface. The film had a RMS roughness of 9 nm. Based on FIG. 3B, the film has a coverage of 2.51 $\mu m^2$ over an area of 26.43 $\mu m^2$, for a film coverage of 9.32%. This coating did not exhibit ionic barrier properties.

Example 9B

The resultant film is illustrated in FIG. 3C (a SEM photograph) and FIG. 3D (a digitized image showing black where the film roughness protrudes from the surface. The film had a RMS roughness of ~35 nm. Based on FIG. 3D, the film has a coverage of 8.84 $\mu m^2$ over an area of 26.88 $\mu m^2$, for a film coverage of 32.88%. This coating does exhibit ionic barrier properties.

Example 9C

The resultant film is illustrated in FIG. 3E (a SEM photograph) and FIG. 3F (a digitized image showing black where the film roughness protrudes from the surface. The film had a RMS roughness of 30 mm. Based on FIG. 3F, the film has a coverage of 8.94 $\mu m^2$ over an area of 26.62 $\mu m^2$, for a film coverage of 8.94%. This coating does not exhibit the ionic barrier properties.

Example 10A

A film was formed by the recipe shown in Table 3 using steps 1 through 13, 18 through 22 were used. The water injection time in Step #3 and Step #9 was 30" and surface treatment chemistry in Step #19 was FODCMS.

The resultant film is illustrated in FIG. 16A (a SEM photograph) and FIG. 16B (a digitized image showing black where the film roughness protrudes from the surface. The film had a RMS roughness of ~50 nm. Based on FIG. 16A, the film has a coverage of 296.08 $\mu m^2$ over an area of 899.99 $\mu m^2$, for a film coverage of 32.92%.

Example 10B

In FIG. 16B, the digital image of the SEM photograph is shown which is converted to have a coverage of 296.08 $\mu m^2$ over an area of 899.99 $\mu m^2$, for a film coverage of 32.92%.

A higher resolution SEM of the same sample in FIG. 16A is shown in FIG. 16C. In FIG. 16D (a digitized image showing black where the film roughness protrudes from the surface). The film had a RMS roughness of ~50 nm Based on FIG. 16D, the film has a coverage of 0.776 $\mu m^2$ over an area of 2.63 $\mu m^2$, for a film coverage of 29.5%. This illustrates that the IMAGEJ digital conversion process is independent of the magnification.

Example 11A

A film was formed by the recipe shown in Table-3 using steps 1 through 13, 18 through 22 were used. The surface treatment chemistry was FDTS in Step #19.

The resultant film was subjected to durability testing using a Hysitron scanning probe. The film was subject to scrubbing from the scanning probe with a force of 10 $\mu N$. A pyramid-shaped Berkovich probe tip having a 150 nm radius with a controlled reciprocating scratch with 100 cycles, a length of 3 $\mu m$, at a rate of four seconds is applied to the film. The result is shown in FIG. 17A. The film was almost entirely removed in the area subjected to testing.

Example 11B

A film was formed by the process of EXAMPLE 11A using steps #1 through step #22. The linker chemistry used in Step #15 was Bis-Trichlorosilane-ethane.

The resultant film was subjected to the same testing as that of Example 11A. The result is shown in FIG. 17B. While some deterioration is observed in the tested area, the film is still intact.

Example 11C

A film was formed by the process of EXAMPLE 11A using steps #1 through step #22. The linker chemistry used in Step #15 was Bis-Trichlorosilane-ethane.

The film was subject to the same testing as that of Example 11A, but the applied pressure was 50 $\mu mN$. The result is shown in FIG. 17C. The film was entirely removed in the area subjected to pressure.

What is claimed is:

1. A composite comprising a substrate and
   a protective anti-wetting and/or superhydrophobic film on the substrate, wherein:
   the film comprises non-conductive particles selected from the group consisting of semiconductor oxide particles, metal oxide particles, and latex particles;

the non-conductive particles are linked to each other and to the substrate using linker molecules; and the film has an RMS surface roughness of 25 nm to 500 nm, a film coverage of 25% to 60%, a thermodynamic surface energy of less than 70 dyne/cm, and a durability in the range of 10 to 5000 microNewtons.

2. The composite of claim 1, wherein the film has a durability in the range of 10 to 500 microNewtons.

3. The composite of claim 2, wherein the film has a thickness 3 to 100 times the RMS surface roughness of the film.

4. The composite of claim 1, wherein the non-conductive particles are metal oxide or semiconductor oxide particles.

5. The composite of claim 4, wherein the non-conductive particles are alumina or silica particles.

6. The composite of claim 4, wherein the non-conductive particles are alumina particles have a particle size of about 40-60 nm.

7. The composite of claim 4, wherein the non-conductive particles are silica particles have a particle size of about 10-20 nm.

8. The composite of claim 1, wherein the non-conductive particles are latex particles.

9. The composite of claim 1, wherein the linker molecules are selected from the group consisting of bi-functional linkers such as bis-trichlorosilane-ethane, bis-trichlorosilane-butane, bis-trichlorosilane-hexane, bis-trimethoxysilane-ethane, bis-trimethoxysilane-butane, bis-trimethoxysilane-hexane, bis-tris-dimethylaminosilane-ethane, bis-tris-dimethylaminosilane-butane, and bis-tris-dimethylaminosilane-hexane.

10. The composite of claim 9, wherein the linker molecules are silanes having a reactive group at two ends.

11. The composite of claim 1, wherein the linker molecules comprise tetrachlorosilane.

12. The composite of claim 1, wherein the film further comprises a low thermodynamic surface energy coating disposed over the non-conductive particles and linker molecules.

13. The composite of claim 1, wherein the substrate is a printed circuit board.

14. The composite of claim 1, wherein the substrate is a consumer electronic device.

15. The composite of claim 1 wherein the substrate comprises a first electrical connector under the film, and the film is operable to be penetrated by a mating electrical connector to form a low contact resistance electrical connection between the mating electrical connector and the first electrical connector.

16. A composite comprising a substrate and a film on the substrate, the film having a film coverage in the range of 25 to 60 percent, an RMS surface roughness of 25 nm to 500 nm, a thermodynamic surface energy less than 70 dyne/cm, and a film durability in the range of 10 to 5000 microNewtons;

wherein the film comprises non-conductive particles linked to each other and to the substrate with linker molecules, and a low thermodynamic surface energy coating having a surface energy of less than 70 dyne/cm disposed over the non-conductive particles and linker molecules; and the low surface energy coating comprises a material selected from the group consisting of long chain hydrocarbons, long chain fluorocarbons, phosphonates, thiols, and ring structures.

17. A composite comprising a substrate and a film, the film comprising non-conductive particles in a size range of about 10-60 nm, linked to each other and to the substrate with linker molecules, and a low surface energy coating having a thermodynamic surface energy less than 70 dyne/cm;

wherein the film has
a film coverage in the range of 25 to 60 percent on the substrate,
a durability in the range of 10 to 5000 microNewtons, and
an RMS surface roughness in the range of 25 nm to 500 nm; and the low surface energy coating comprises a material selected from the group consisting of C8 (n-Octyltrichlorosilane ($C_8H_{17}Cl_3Si$)), C10 (n-Decyltrichlorosilane ($C_{10}H_{21}Cl_3Si$)) or n-Decyltriethoxysilane ($C_{16}H_{36}O_3Si$), C11 (Undecyltrichlorosilane ($C_{11}H_{23}Cl_3Si$)), C12 (Dodecyltrichlorosilane ($C_{12}H_{25}Cl_3Si$)) or Dodecyltriethoxysilane ($C_{18}H_{40}O_3Si$)), C14 (Tetradecyltrichlorosilane ($C_{14}H_{25}Cl_3Si$)), C18 (n-Octadecyltrichlorosilane ($C_{18}H_{37}Cl_3Si$)) or (n-Octadecyltrimethoxysilane ($C_{21}H_{46}O_3Si$)), FDTS ((Heptadecafluoro-1,1,2,2-TetraHydrodecyl)Trichlorosilane ($C_{10}H_4Cl_3F_{17}Si$)), FODCMS ((Tridecafluoro-1,1,2,2-Tetrahydro-Octyl)methyldichlorosilane) ($C_9H_7Cl_2F_{13}Si$)), and FOTS ((Tridecafluoro-1,1,2,2-Tetrahydro-Octyl)Trichlorosilane $C_8H_4Cl_3F_{13}Si$).

18. A composite comprising a protective anti-wetting film having an RMS surface roughness in the range of approximately 25 nm to 500 nm, a film coverage of 25 to 60 percent, and a durability in the range of 10 to 5000 microNewtons on a substrate, wherein the protective anti-wetting film includes:
particles having sizes in the range of approximately 10 to 60 nanometers in contact with the surface of the substrate that are bound to each other and to the surface of the substrate with linker molecules, and
a coating having a thermodynamic surface energy less than 70 dynes per square centimeter disposed over the linker molecules; and wherein the particles comprise a non-conductive substance selected from the group consisting of a semiconductor oxide and a metal oxide.

19. The composite of claim 18 wherein the protective anti-wetting film is super-hydrophobic.

20. The composite of claim 18 wherein the protective anti-wetting film is resistant to wetting by oils and/or organic solvents.

21. The composite of claim 18 wherein the substrate comprises a first electrical connector under the film, and the film is operable to be penetrated by a mating electrical connector to form a low contact resistance electrical connection between the mating electrical connector and the first electrical connector.

22. The composite of claim 18 wherein the coating comprises a covalent bond structure arising from a self-assembled monolayer.

* * * * *

UNITED STATES PATENT AND TRADEMARK OFFICE
CERTIFICATE OF CORRECTION

| | |
|---|---|
| PATENT NO. | : 7,968,187 B2 |
| APPLICATION NO. | : 12/209629 |
| DATED | : June 28, 2011 |
| INVENTOR(S) | : Jeff Chinn et al. |

It is certified that error appears in the above-identified patent and that said Letters Patent is hereby corrected as shown below:

Delete the title page and substitute therefore the attached title page consisting of the corrected number of drawings in patent and corrected illustrative figure.

Delete Drawings Sheets 1-15 and substitute therefore the attached Drawings Sheets 1-17.

Signed and Sealed this
Thirtieth Day of August, 2011

David J. Kappos
*Director of the United States Patent and Trademark Office*

(12) United States Patent
Chinn et al.

(10) Patent No.: US 7,968,187 B2
(45) Date of Patent: *Jun. 28, 2011

(54) SURFACE COATING

(75) Inventors: Jeff Chinn, Menlo Park, CA (US); W. Robert Ashurst, Auburn, AL (US); Adam Anderson, Auburn, AL (US)

(73) Assignee: Integrated Surface Technologies, Menlo Park, CA (US)

(*) Notice: Subject to any disclaimer, the term of this patent is extended or adjusted under 35 U.S.C. 154(b) by 78 days.
This patent is subject to a terminal disclaimer.

(21) Appl. No.: 12/209,629

(22) Filed: Sep. 12, 2008

(65) Prior Publication Data
US 2009/0107713 A1  Apr. 30, 2009

Related U.S. Application Data

(60) Provisional application No. 60/983,504, filed on Oct. 29, 2007, provisional application No. 61/029,801, filed on Feb. 19, 2008.

(51) Int. Cl.
*B32B 7/12* (2006.01)
*H01L 23/29* (2006.01)

(52) U.S. Cl. ........ 428/339; 428/142; 428/143; 428/145; 428/148; 428/352; 257/789; 257/791; 257/635; 257/642

(58) Field of Classification Search ............ 174/255, 174/258; 428/142, 143, 145, 148, 339, 352; 257/635, 642, 789, 791
See application file for complete search history.

(56) References Cited

U.S. PATENT DOCUMENTS

| | | | | |
|---|---|---|---|---|
| 5,656,830 A * | 8/1997 | Zechman | ............ | 257/784 |
| 6,138,349 A * | 10/2000 | Vinciarelli et al. | ............ | 29/841 |
| 6,902,947 B2 * | 6/2005 | Chinn et al. | ............ | 438/48 |
| 7,329,439 B2 * | 2/2008 | Sachdev et al. | ............ | 427/517 |
| 7,638,167 B2 * | 12/2009 | Kobrin et al. | ............ | 427/248.1 |

* cited by examiner

*Primary Examiner* — Cathy Lam
(74) *Attorney, Agent, or Firm* — Daniel L. Flamm

(57) ABSTRACT

A composite is provided, comprising a substrate and a film on the substrate. The film has an RMS surface roughness of 25 nm to 500 nm, a film coverage of 25% to 60%, a surface energy of less than 70 dyne/cm; and a durability of 10 to 5000 microNewtons. Depending on the particular environment in which the film is to be used, a durability of 10 to 500 microNewtons may be preferred. A film thickness 3 to 100 times the RMS surface roughness of the film is preferred.

22 Claims, 17 Drawing Sheets

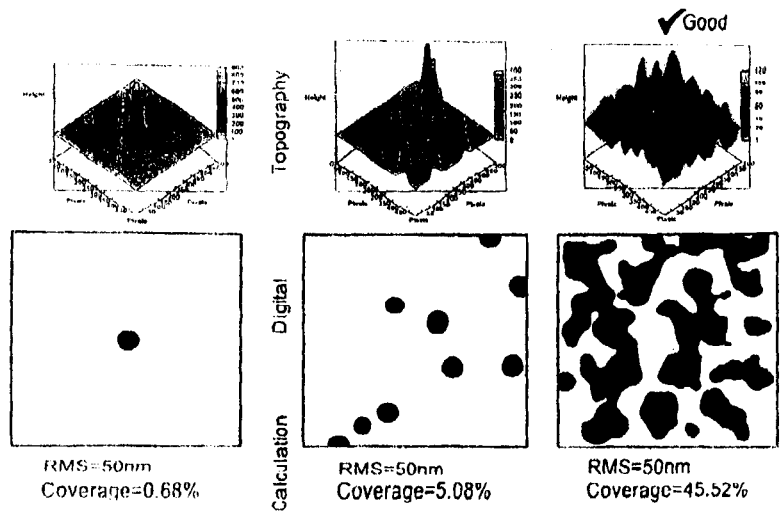

Figure 3A    Figure 3C    Figure 3E
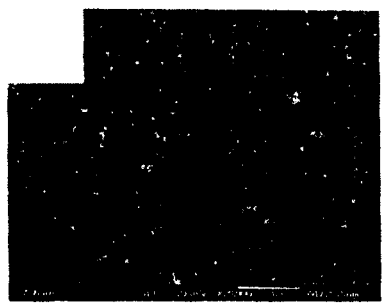 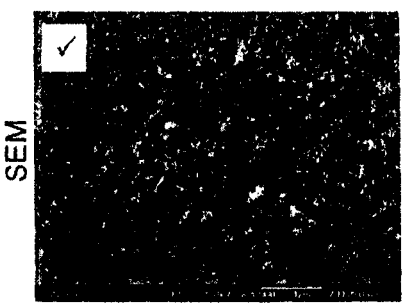 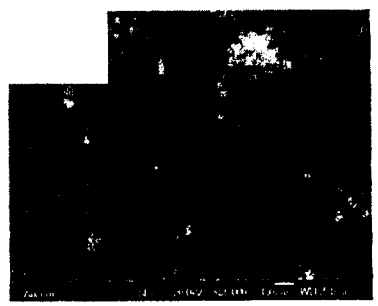
Figure 3B    Figure 3D    Figure 3F
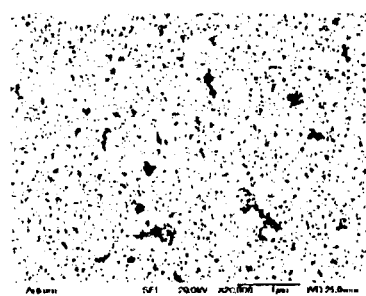 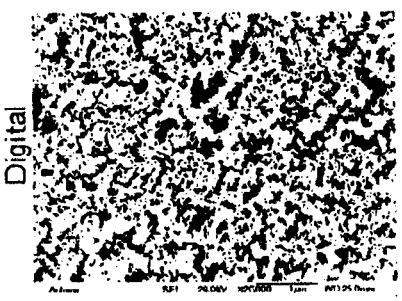 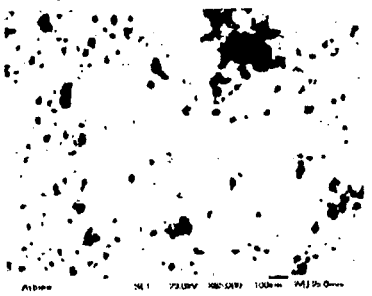
RMS: ~9nm
Area: 26.43µm²
Particle Area: 2.51µm²
Percentage: 9.32%
Area: 26.88µm²
Particle Area: 8.84µm²
Percentage: 32.88%
RMS: ~30nm
Area: 2.62µm²
Particle Area: 0.234µm²
Percentage: 8.94%
FIGURE 3

FIG. 4A
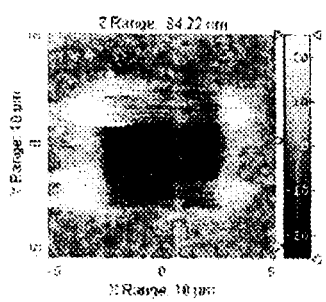

Wear areas from the Standard Film at 10μN. Note that the film seems to be smear or "pushed" around by the stylus. A film with less durability than shown would be too unstable for protecting a surface. The film could be blown away.

FIG. 4B
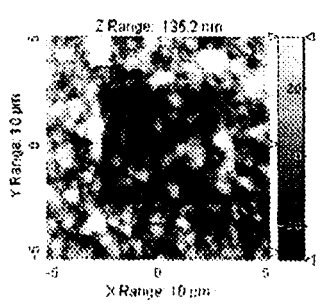

Wear areas from a more durable Film at 10μN. The film is still there although some deterioration is observed.

FIG. 4C
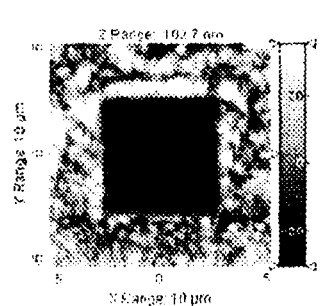

Example where the film is completely removed under a load of 50μN. (All pushed away.)

FIG. 4

| Chemistry | Critical Surface Tension * | Contact Angle >135° | Does it Work ? |
|---|---|---|---|
| DDMS (Dichlorodimethylsilane) (Hydro-carbon) | >75 dyne/cm | NO | NO |
| FDTS (Perfluoronated) | 15-20 dyne/cm | YES | YES |
| OTS (C18) (Hydro-carbon) | 20-25 dyne/cm | YES | YES |
| Octyl-saline (C8) (Hydro-carbon) | 25-35 dyne/cm | YES | YES |

FIGURE 5

Non-Wetting Surface

Experiment: Exposure of printed circuit boards with various coatings to an ionic solution.

- Test Solution: Gatorade™ (solution having potasium phosphate and citric acid)

- Observations: Residues were observed on boards which did not have a sufficiently high contact angle.

Figure 10:
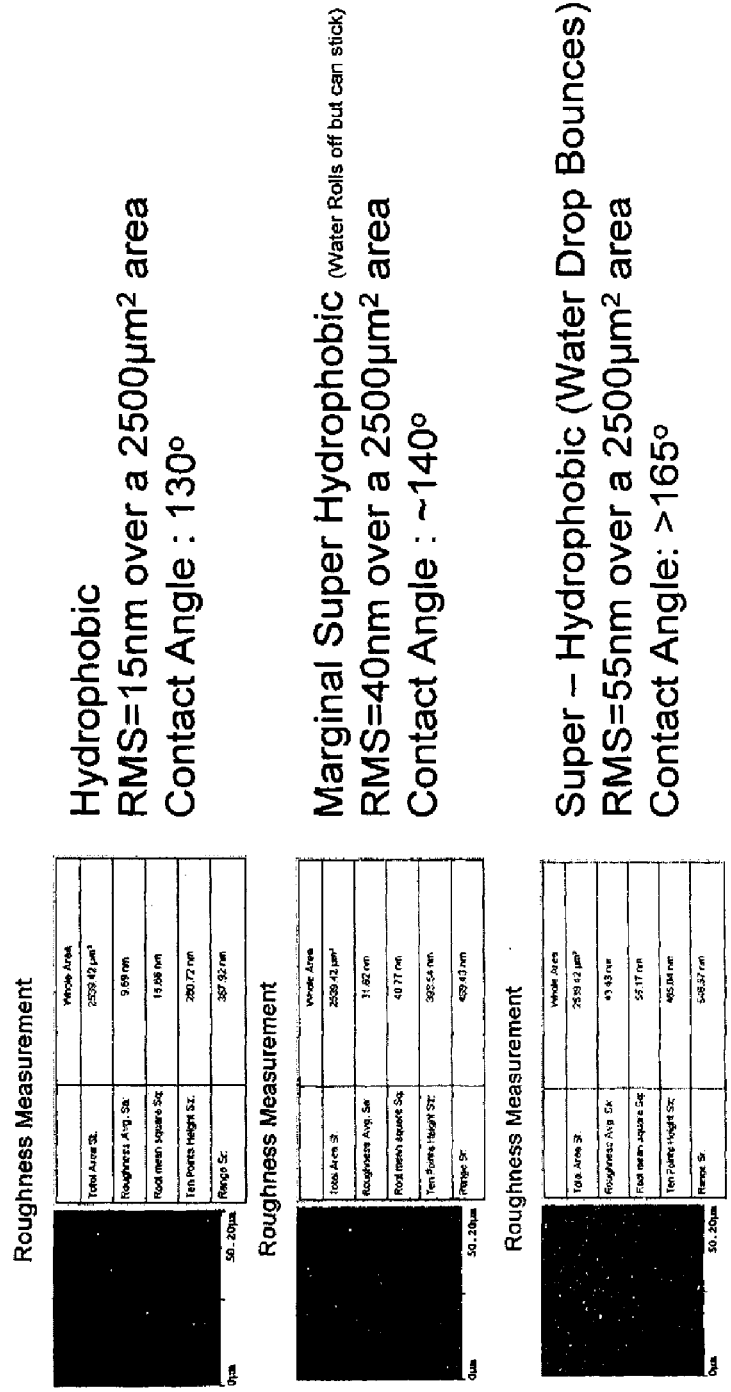
FIG. 10 shows atomic force microscopy measurements of surfaces having a texturized coating applied using different process parameters.
Figure 14:
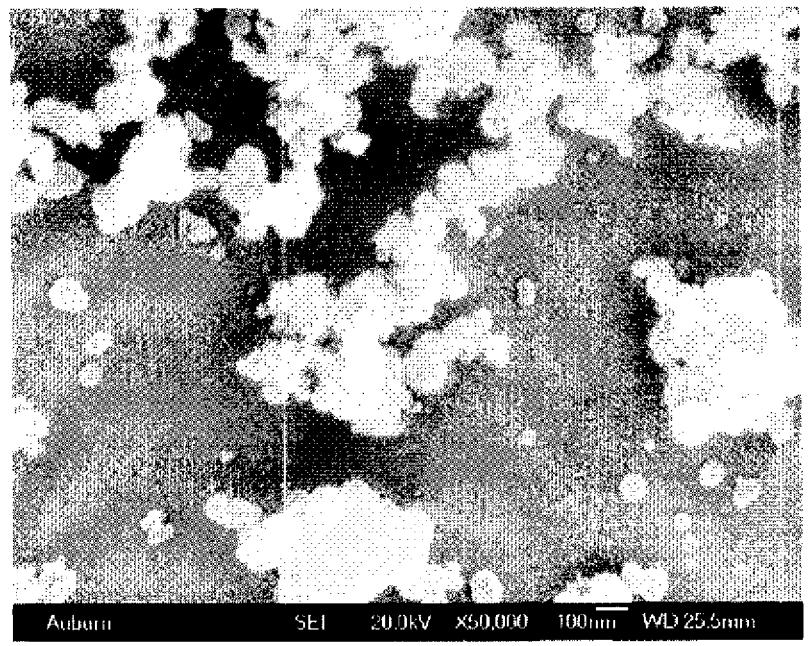

Process
- Surface roughness + low surface energy is the key factor to the anti-wetting / ionic contamination control
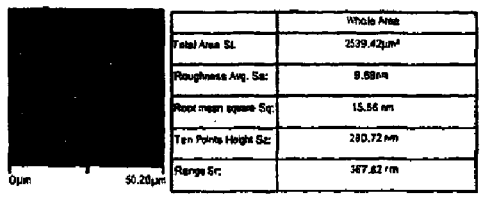
Hydrophobic
RMS=15nm over a 2500μm² area
Contact Angle : 130°
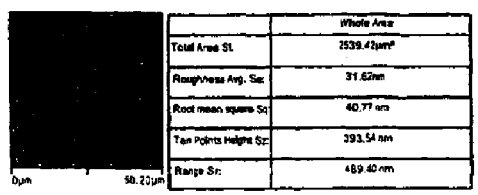
Marginal Super Hydrophobic (Water Rolls off but can stick)
RMS=40nm over a 2500μm² area
Contact Angle : ~140°
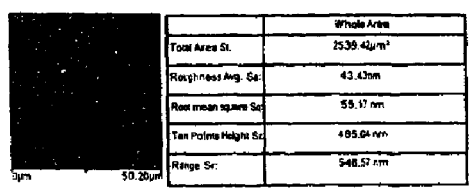
Super - Hydrophobic (Water Drop Bounces)
RMS=55nm over a 2500μm² area
Contact Angle :>165°
FIGURE 10

- Surface roughness + low surface energy is the key factor to the anti-wetting / ionic contamination control

Hydrophobic
RMS=15nm over a 2500μm² area
Contact Angle : 130°

Marginal Super Hydrophobic (Water Rolls off but can stick)
RMS=40nm over a 2500μm² area
Contact Angle : ~140°

Super - Hydrophobic (Water Drop Bounces)
RMS=55nm over a 2500μm² area
Contact Angle :>165°

FIGURE 10

FIG. 11A
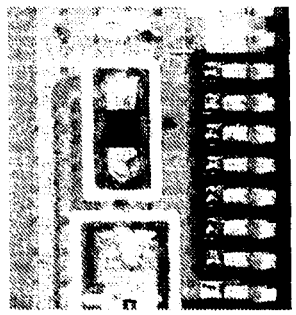
USB 512 MB Memory
Pitch 1500/500μm lead/space

FIG. 11B
Control Sample
Contact Angle: <40°

FIG. 11C
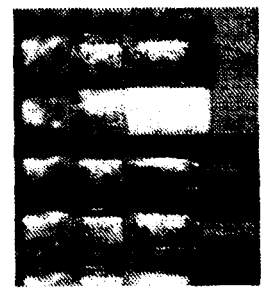
Coated with
Superhyrdophobic
Contact Angle: >165°
No visible film
or thickness

FIG. 11D
1500μm {
500μm {

Note 1: There may be a practical limitation on surface roughness. If a surface roughness is too great, then this is similar to whisker formatin or dentrite growth, which becomes undesireable and can cause a short.

Note 2: If a film is too thick (or too rough), then thickness could affect electrical connections between connectors.

FIG. 11

Insufficient Surface Roughness/Density
[RMS Roughness: 15nm
Contact Angle: 130°]
FIG. 12 A
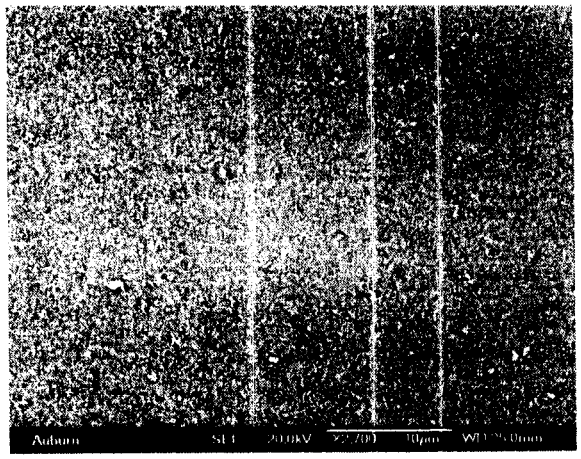
FIG. 12 C
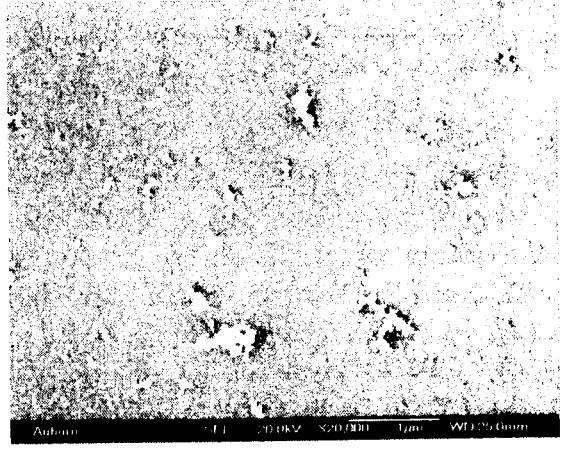
FIG. 12 B
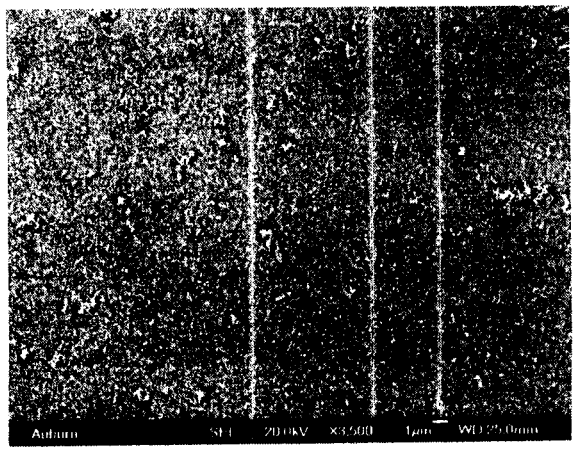
FIG. 12 D
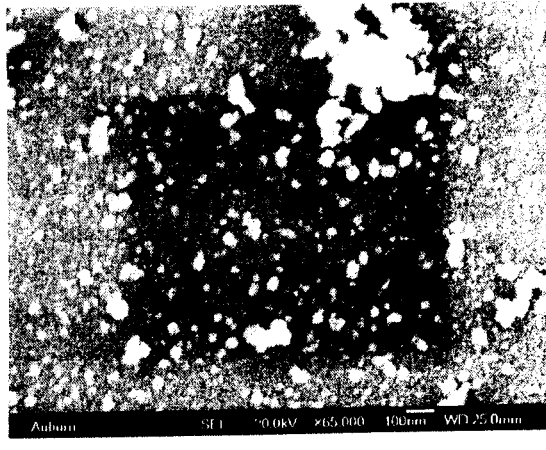
FIG. 12

Required Surface Roughness / Density
FIG. 13A
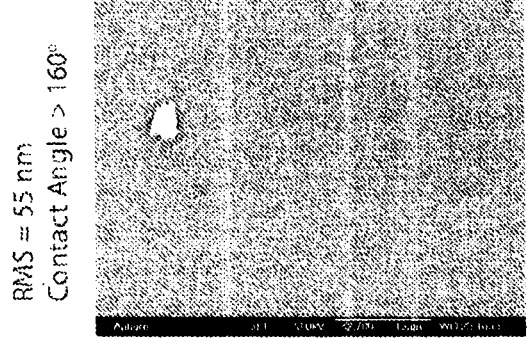
RMS = 55 nm
Contact Angle > 160°
FIG. 13C
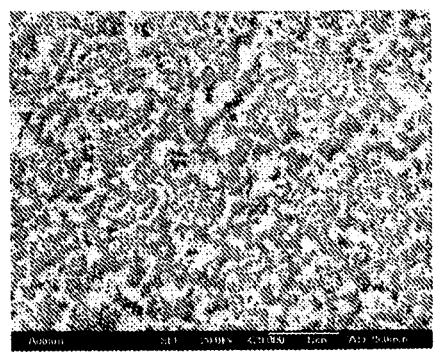
FIG. 13B
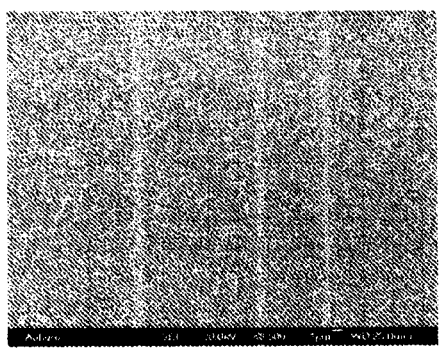
FIG. 13D
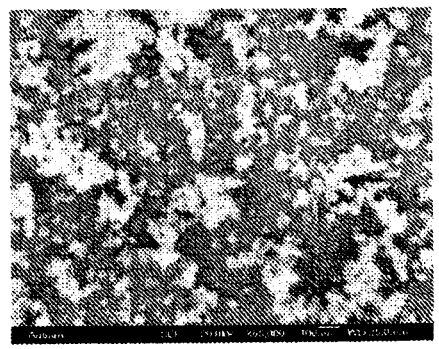
FIG. 13

SEM Showing Surface Roughness of Film With Aluminum Oxide Particles

RMS roughness: 55nm
Contact Angle: >160°

Example of Improve Durability
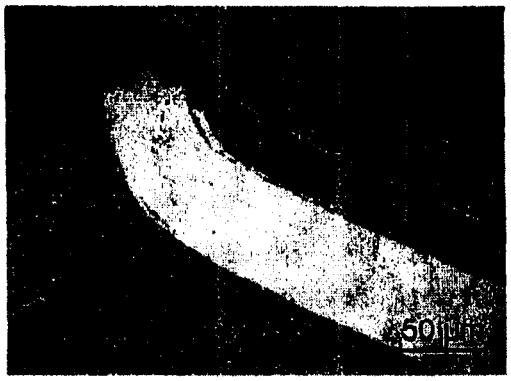
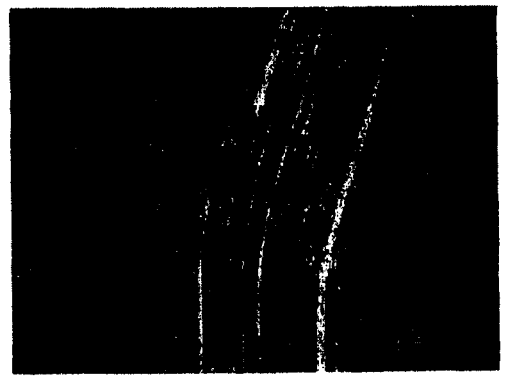
Figure 15A
Figure 15B
Fig. (Left): An optical micrograph showing our initial nano-coating with its poor mechanical stability after scratching.
Fig. (Right): An optical micrograph showing the improved JST film. The mechanical endurance is significantly improved.
FIGURE 15

Quantitative Analysis for Good Film
FIG. 16 A
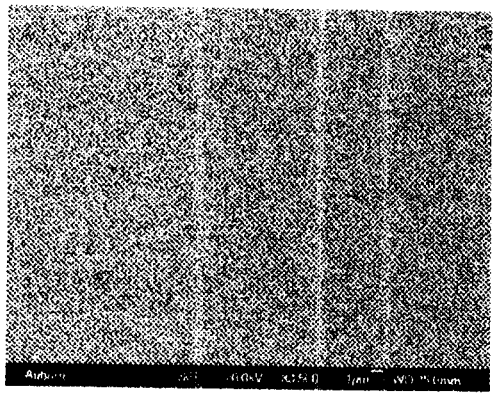
FIG. 16 C
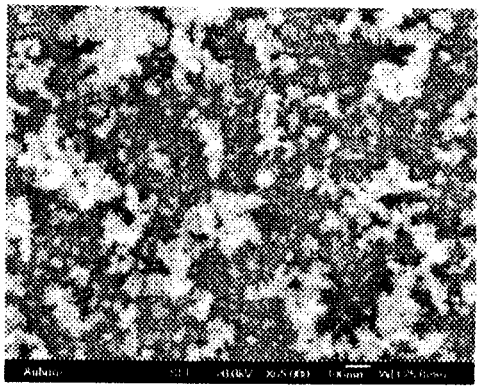
FIG. 16 B
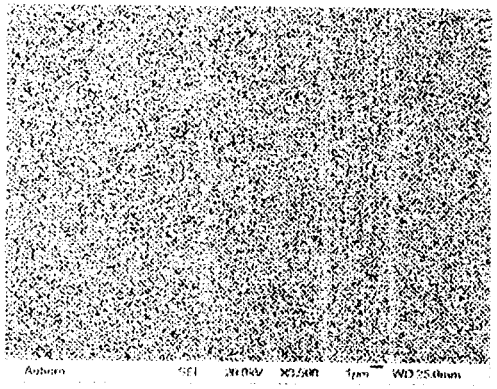
FIG. 16 D
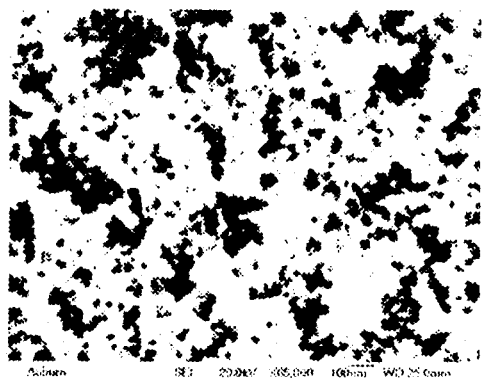
Area: 899μm$^2$
Particle Area: 296.08μm$^2$
Film Coverage: 32.92%
Area: 2.63μm$^2$
Particle Area: 0.776μm$^2$
Film Coverage: 29.5%
FIG. 16

UNITED STATES PATENT AND TRADEMARK OFFICE
CERTIFICATE OF CORRECTION

| | | |
|---|---|---|
| PATENT NO. | : 7,968,187 B2 | |
| APPLICATION NO. | : 12/209629 | |
| DATED | : June 28, 2011 | |
| INVENTOR(S) | : Jeff Chinn et al. | |

It is certified that error appears in the above-identified patent and that said Letters Patent is hereby corrected as shown below:

Delete the title page and substitute therefore the attached title page consisting of the corrected number of drawings in patent and corrected illustrative figure.

Delete Drawings Sheets 1-15 and substitute therefore the attached Drawings Sheets 1-17.

This certificate supersedes the Certificate of Correction issued August 30, 2011.

Signed and Sealed this
Sixth Day of December, 2011

David J. Kappos
*Director of the United States Patent and Trademark Office*

(12) United States Patent
Chinn et al.

(10) Patent No.: US 7,968,187 B2
(45) Date of Patent: *Jun. 28, 2011

(54) SURFACE COATING

(75) Inventors: Jeff Chinn, Menlo Park, CA (US); W. Robert Ashurst, Auburn, AL (US); Adam Anderson, Auburn, AL (US)

(73) Assignee: Integrated Surface Technologies, Menlo Park, CA (US)

(*) Notice: Subject to any disclaimer, the term of this patent is extended or adjusted under 35 U.S.C. 154(b) by 78 days.
This patent is subject to a terminal disclaimer.

(21) Appl. No.: 12/209,629

(22) Filed: Sep. 12, 2008

(65) Prior Publication Data
US 2009/0107713 A1 Apr. 30, 2009

Related U.S. Application Data

(60) Provisional application No. 60/983,504, filed on Oct. 29, 2007, provisional application No. 61/029,801, filed on Feb. 19, 2008.

(51) Int. Cl.
*B32B 7/12* (2006.01)
*H01L 23/29* (2006.01)

(52) U.S. Cl. ........ 428/339; 428/142; 428/143; 428/145; 428/148; 428/352; 257/789; 257/791; 257/635; 257/642

(58) Field of Classification Search .............. 174/255, 174/258; 428/142, 143, 145, 148, 339, 352; 257/635, 642, 789, 791
See application file for complete search history.

(56) References Cited

U.S. PATENT DOCUMENTS

| | | | |
|---|---|---|---|
| 5,656,830 A * | 8/1997 | Zechman | 257/784 |
| 6,138,349 A * | 10/2000 | Vinciarelli et al. | 29/841 |
| 6,902,947 B2 * | 6/2005 | Chinn et al. | 438/48 |
| 7,329,439 B2 * | 2/2008 | Sachdev et al. | 427/517 |
| 7,638,167 B2 * | 12/2009 | Kobrin et al. | 427/248.1 |

* cited by examiner

*Primary Examiner* — Cathy Lam
(74) *Attorney, Agent, or Firm* — Daniel L. Flamm

(57) ABSTRACT

A composite is provided, comprising a substrate and a film on the substrate. The film has an RMS surface roughness of 25 nm to 500 nm, a film coverage of 25% to 60%, a surface energy of less than 70 dyne/cm; and a durability of 10 to 5000 microNewtons. Depending on the particular environment in which the film is to be used, a durability of 10 to 500 microNewtons may be preferred. A film thickness 3 to 100 times the RMS surface roughness of the film is preferred.

22 Claims, 17 Drawing Sheets

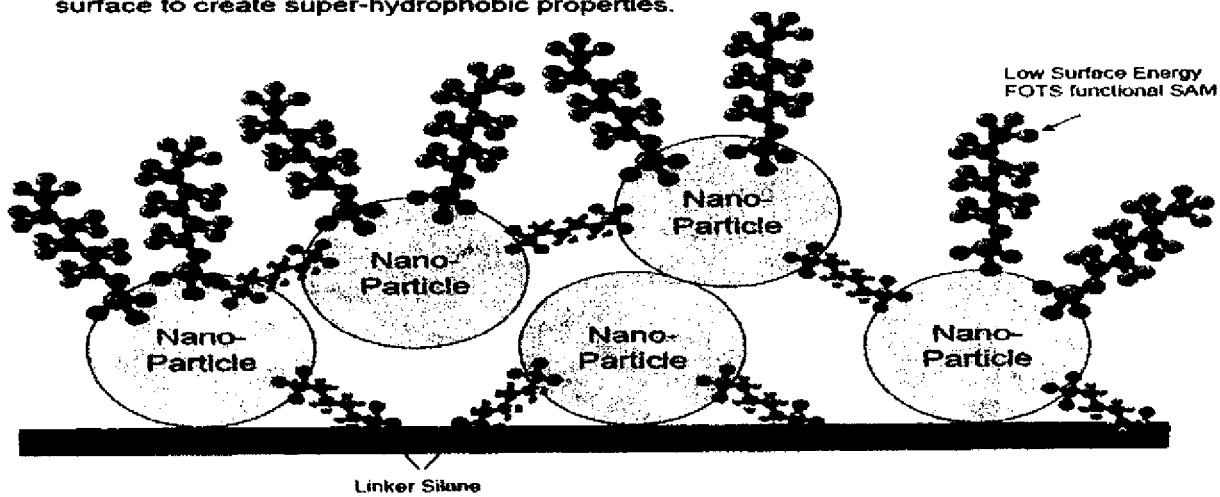

Durability Improvement

- Nano-particles adhesion improved with silane linker make a more durable film.
- Subsequent – Low Surface Energy coating (ie. FOTS) applied to nano-particle surface to create super-hydrophobic properties.

Figure 3A
Figure 3B
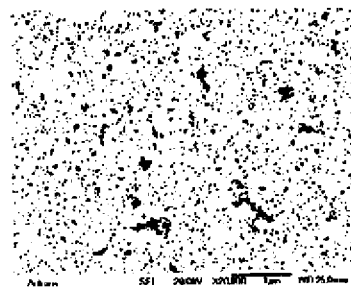
RMS: ~9nm
Area: 26.43μm²
Particle Area: 2.51μm²
Percentage: 9.32%
Figure 3C
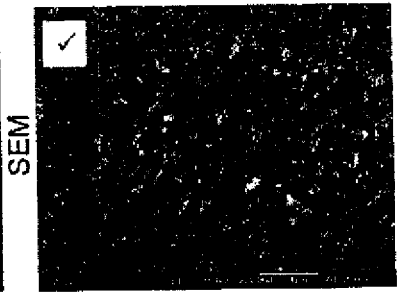
Figure 3D
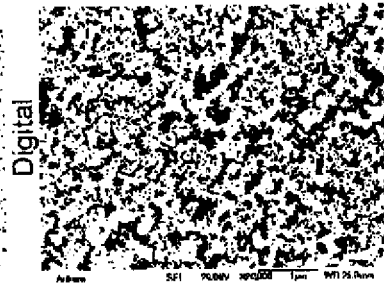
Area: 26.88μm²
Particle Area: 8.84μm²
Percentage: 32.88%
Figure 3E
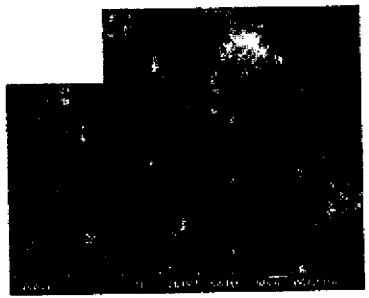
Figure 3F
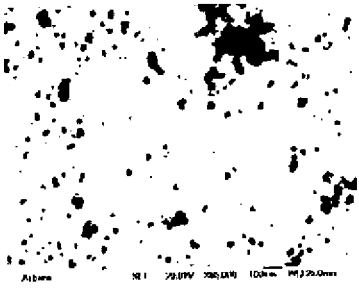
RMS: ~30nm
Area: 2.62μm²
Particle Area: 0.234μm²
Percentage: 8.94%
FIGURE 3

FIG. 4A

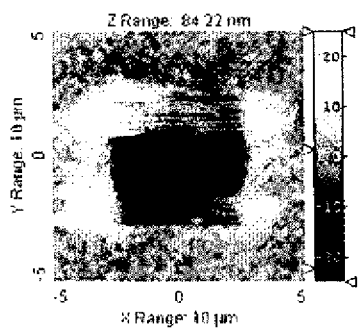

Wear areas from the Standard Film at 10μN. Note that the film seems to be smear or "pushed" around by the stylus.
A film with less durability than shown would be too unstable for protecting a surface. The film could be blown away.

FIG. 4B

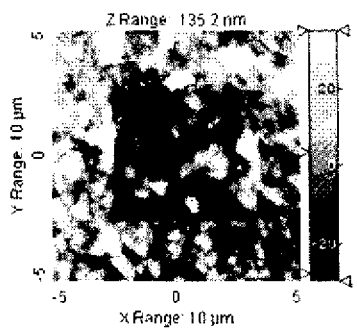

Wear areas from a more durable Film at 10μN. The film is still there although some deterioration is observed.

FIG. 4C

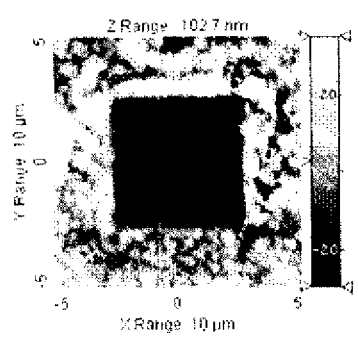

Example where the film is completely removed under a load of 50μN. (All pushed away.)

FIG. 4

| Chemistry | Critical Surface Tension * | Contact Angle >135° | Does it Work ? |
|---|---|---|---|
| DDMS (Dichlorodimethylsilane) (Hydro-carbon) | >75 dyne/cm | NO | NO |
| FDTS (Perfluoronated) | 15-20 dyne/cm | YES | YES |
| OTS (C18) (Hydro-carbon) | 20-25 dyne/cm | YES | YES |
| Octyl-saline (C8) (Hydro-carbon) | 25-35 dyne/cm | YES | YES |

FIGURE 5

FIG. 11A
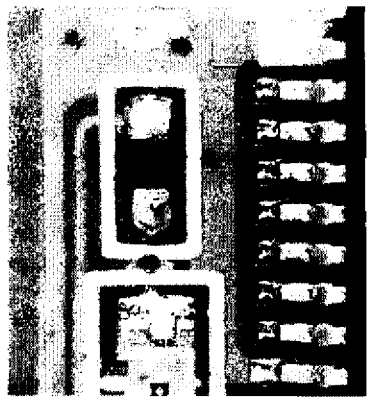
USB 512 MB Memory
Pitch 1500/500μm lead/space

FIG. 11B
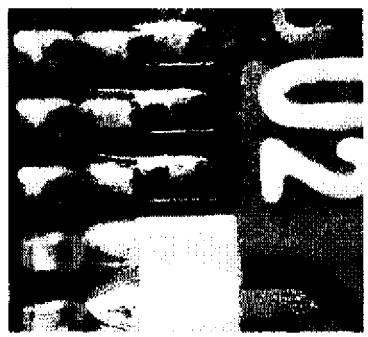
Control Sample
Contact Angle: <40°

FIG. 11C
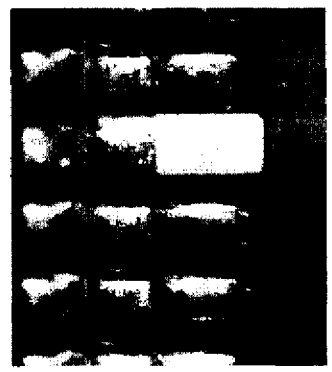
Coated with
Superhyrdophobic
Contact Angle: >165°
No visible film
or thickness

FIG. 11D
1500μm
500μm

Note 1: There may be a practical limitation on surface roughness. If a surface roughness is too great, then this is similar to whisker formatin or dentrite growth, which becomes undesireable and can cause a short.

Note 2: If a film is too thick (or too rough), then thickness could affect electrical connections between connectors.

FIG. 11

Insufficient Surface Roughness/Density
RMS Roughness: 15nm
Contact Angle: 130°
FIG. 12 A
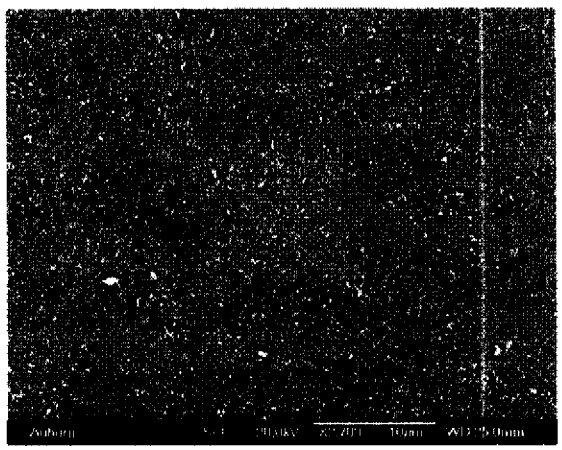
FIG. 12 C
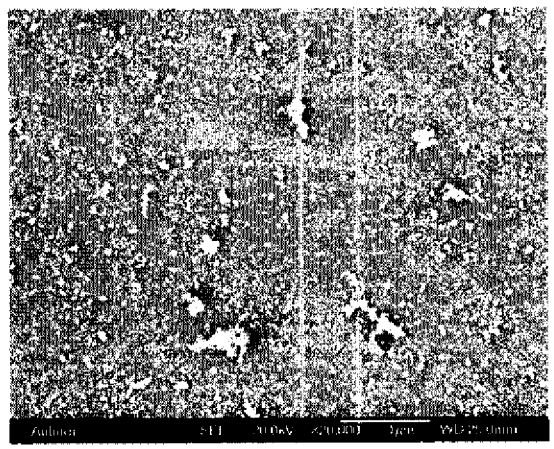
FIG. 12 B
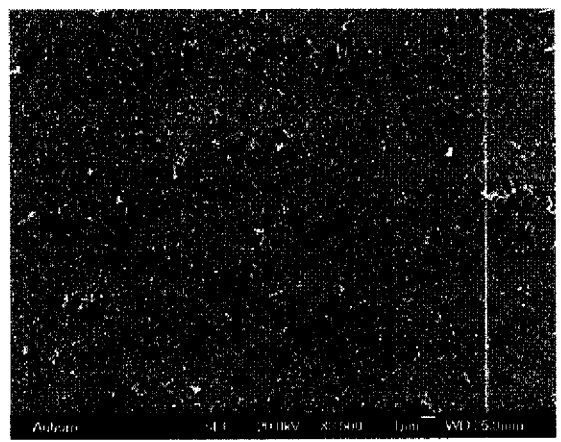
FIG. 12 D
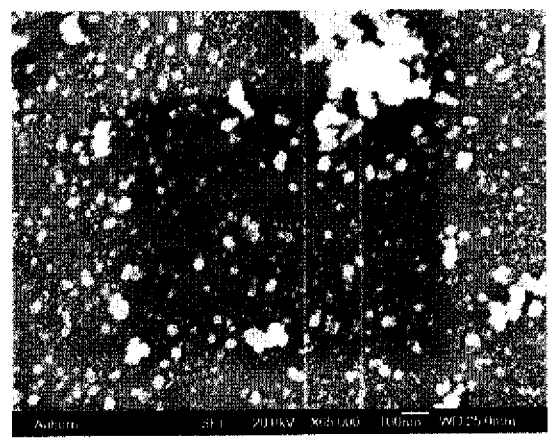
FIG. 12

Required Surface Roughness / Density
FIG. 13A
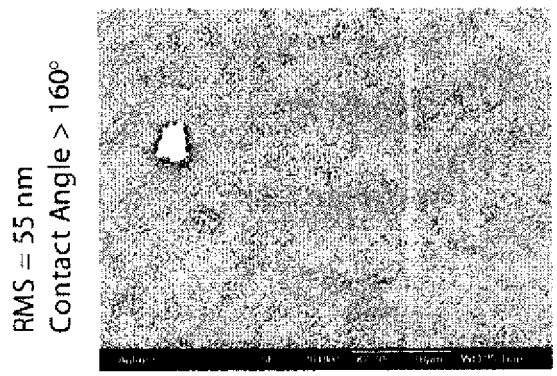
RMS = 55 nm
Contact Angle > 160°
FIG. 13C
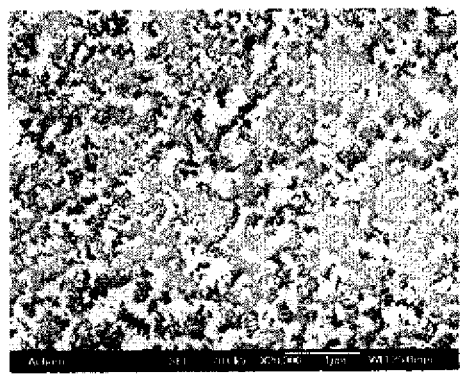
FIG. 13B
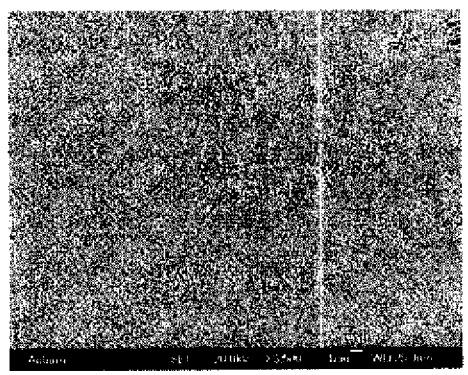
FIG. 13D
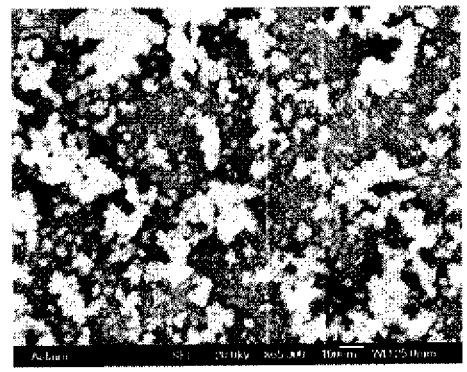
FIG. 13

SEM Showing Surface Roughness of
Film With Aluminum Oxide Particles

RMS roughness: 55nm
Contact Angle: >160°

Example of Improve Durability
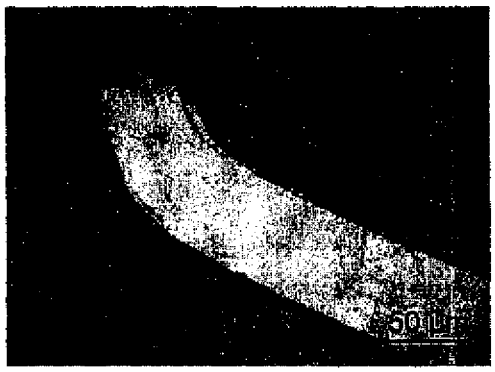
Figure 15A
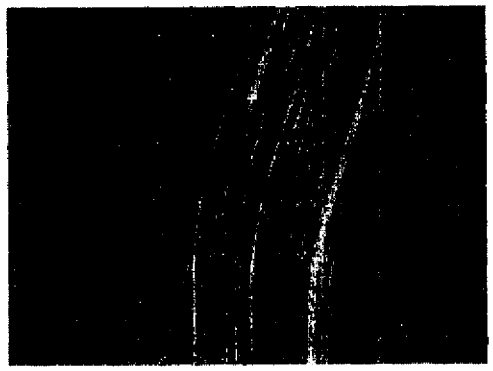
Figure 15B
Fig. (Left): An optical micrograph showing our initial nano-coating with its poor mechanical stability after scratching.
Fig. (Right): An optical micrograph showing the improved JST film. The mechanical endurance is significantly improved.
FIGURE 15

Quantitative Analysis for Good Film
FIG. 16 A
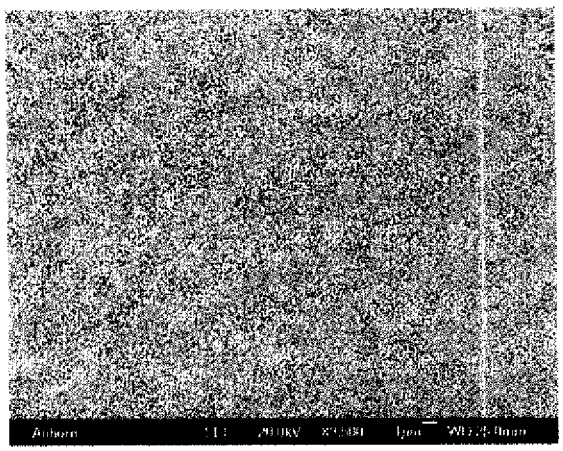
FIG. 16 C
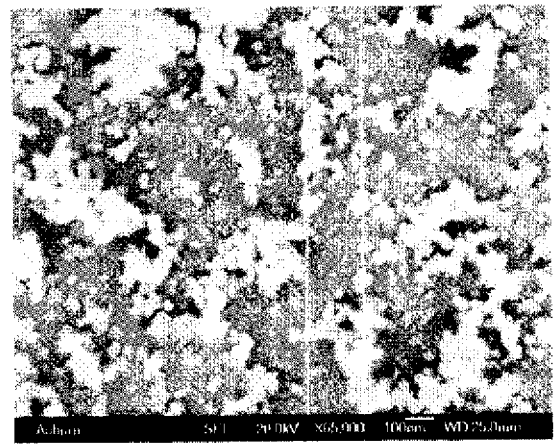
FIG. 16 B
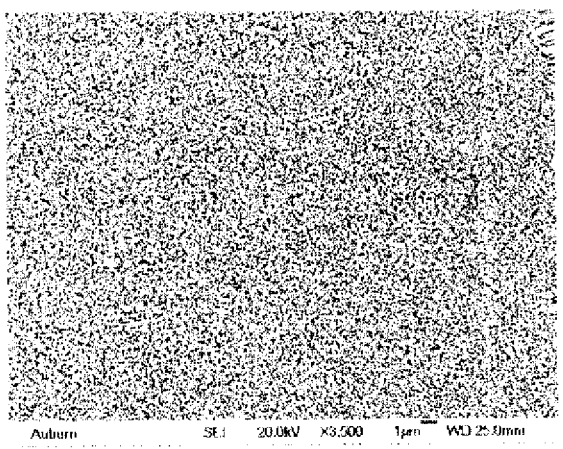
Area: 899μm$^2$
Particle Area: 296.08μm$^2$
Film Coverage: 32.92%
FIG. 16 D
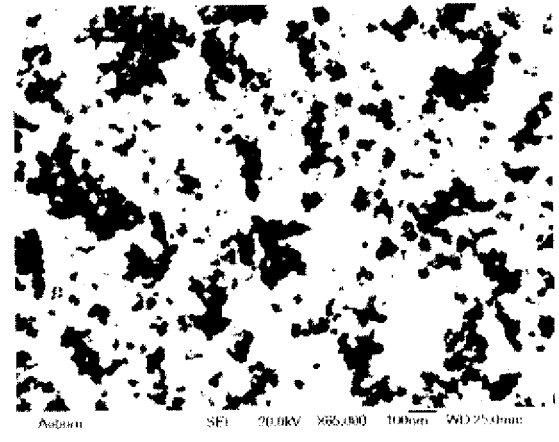
Area: 2.63μm$^2$
Particle Area: 0.776μm$^2$
Film Coverage: 29.5%
FIG. 16

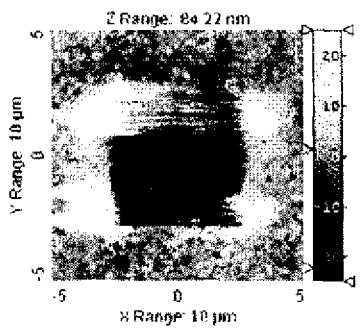

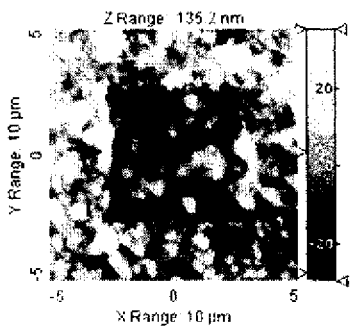

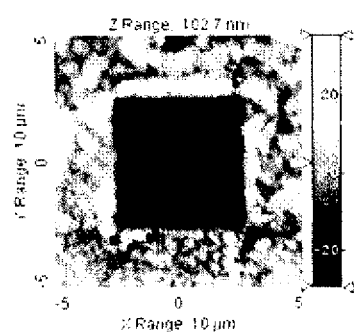

Wear areas from the Standard Film at 10µN. Note that the film seems to be smear or "pushed" around by the stylus.
A film with less durability is too unstable for protecting a surface. The film could be blown away.

Wear areas from a more durable Film at 10µN. The film is still there although some deterioration is observed.

Example where the film is completely removed under a load of 50µN. (All pushed away.)

FIG. 17